United States Patent
Kubota et al.

(10) Patent No.: US 6,661,822 B1
(45) Date of Patent: Dec. 9, 2003

(54) SEMICONDUCTOR LIGHT EMITTING DEVICE AND METHOD OF MANUFACTURING THE SAME

(75) Inventors: Shinichi Kubota, Kanagawa (JP); Kazuhiko Horino, Kanagawa (JP); Akito Kuramata, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/544,654

(22) Filed: Apr. 5, 2000

(30) Foreign Application Priority Data

Apr. 26, 1999 (JP) .......................... 11-118742
Nov. 18, 1999 (JP) .......................... 11-328397

(51) Int. Cl.$^7$ ............................. H01S 5/00
(52) U.S. Cl. .......................... 372/46; 372/45
(58) Field of Search ............... 372/46, 45, 50

(56) References Cited

U.S. PATENT DOCUMENTS 5,974,069 A * 10/1999 Tanaka et al. ................. 372/46
6,072,818 A * 6/2000 Hayakawa .................... 372/46
6,215,803 B1 * 4/2001 Hata ............................ 372/46

FOREIGN PATENT DOCUMENTS

| JP | 62-23191 | 1/1987 | | |
|----|----------|--------|---|---|
| JP | 4-242985 | 8/1992 | | |
| JP | 7-335975 | 12/1995 | | |
| JP | 8-88441 | 4/1996 | | |
| JP | 8-97502 | 4/1996 | | |
| JP | 9-232680 | 9/1997 | | |
| JP | 9-260772 | 10/1997 | | |
| JP | 9-270569 | 10/1997 | | |
| JP | 9-289358 | 11/1997 | | |
| JP | 09-312442 | * 12/1997 | ............. | H01S/3/18 |
| JP | 10-294529 | 11/1998 | | |

* cited by examiner

*Primary Examiner*—Quyen Leung
(74) *Attorney, Agent, or Firm*—Westerman, Hattori, Daniels & Adrian, LLP

(57) ABSTRACT

A lateral mode controlling layer made of AlN having a thickness of more than 0 nm but less than 300 nm is formed in at least one cladding layer of an n-type cladding layer and a p-type cladding layer or formed between the at least one cladding layer and the active layer. Also, a mask layer is formed on a substrate, then an AlN layer is formed to cover it, and then the AlN layer is lifted off by using a solution for etching. the mask layer. Accordingly, lateral mode control of the group III-V compound semiconductor laser can be facilitated, the aspect ratio of the beam shape can be improved, and the damage caused by the Al layer growth and the patterning can be reduced.

13 Claims, 18 Drawing Sheets

Stripe opening width of the Al layer: same
Distance from the active layer of the Al layer: same

SEMICONDUCTOR LIGHT EMITTING DEVICE AND METHOD OF MANUFACTURING THE SAME

BACKGROUND OF THE INVENTION

1. Field of the Invention

The present invention relates to a semiconductor light emitting device and a method of manufacturing the same and, more particularly, a semiconductor light emitting device which is employed as a reading/writing light source for a magneto-optic disk device or a light source for a laser printer and a method of manufacturing the same.

2. Description of the Prior Art

As the group III nitride semiconductor laser, the ridge type semiconductor laser which is formed by the steps without dry-etching the active layer and re-growing the crystal of the current constricting layer, etc. and thus can be formed simply are extensively employed.

For example, as disclosed in Patent Application Publication (KOKAI) Hei 4-242985, there is the semiconductor laser which has a GaN compound semiconductor layer as such ridge type group III nitride semiconductor laser.

As the ridge type semiconductor laser, there is the semiconductor laser which has a structure as shown in FIGS. 1A and 1B.

First, in the semiconductor laser shown in FIG. 1A, a buffer 112 made of aluminum nitride (AlN) and a first cladding layer 113 made of n-type aluminum gallium nitrogen (AlGaN) are formed on a sapphire substrate 111 by the MOVPE (metal organic vapor-phase epitaxy) method. Then, a part of a surface of the first cladding layer 113 is covered with a silicon dioxide ($SiO_2$) film (not shown), and then an active layer 114 made of GaP and a second cladding layer 115 made of p-type AlGaN are formed in sequence on a region of the first cladding layer 113, which is not covered with the $SiO_2$ film, by the MOVPE method.

Then, the $SiO_2$ film is removed by hydrofluoric acid, and then another $SiO_2$ film 116 is formed on the second cladding layer 115. An window 116a for electrode connection is formed in the $SiO_2$ film 116 by the photolithography method.

Then, a p-side electrode 117 and an n-side electrode 118 are formed on the second cladding layer 115 exposed from the window 116a and the first cladding layer 113 located on the side of the cladding layer 115 respectively.

With the above steps, a basic structure of the ridge type GaN semiconductor laser diode can be completed.

By the way, the substrate used in the ridge type semiconductor laser is not limited to sapphire, and a silicon carbide (SiC) substrate may be used. An example of such SiC substrate will be explained. with reference to FIG. 1A.

At first, an n-type AlGaN cladding layer 122, an n-type GaN SCH layer 123, an InGaN active layer 124, a p-type GaN SCH layer 125, a p-type AlGaN cladding layer 126, and a p-type GaN contact layer 127 are formed in sequence on an SiC substrate 121 by the MOVPE method.

Then, a stripe-like $SiO_2$ film (not shown) is formed on the contact layer 127, and then the p-type GaN contact layer 127 and the p-type AlGaN cladding layer 126 are selectively removed in sequence by the well-known dry etching method while using the $SiO_2$ film as a mask, whereby the p-type GaN SCH layer 125 is exposed from both sides of the stripe-like $SiO_2$ film.

Then, the $SiO_2$ film is removed and then another $SiO_2$ film 128 is formed. Then, a contact hole 128a is formed on the contact layer 127 by patterning another $SiO_2$ film 128 by using the well-known photolithography method.

Then, a p-side electrode 129 is formed on the contact layer 127 via the contact hole 128a, and also an n-side electrode 130 is formed under the SiC substrate 121.

With the above steps, a basic structure of the ridge type GaN semiconductor laser diode using SiC as the substrate can-be completed.

In this manner, a heat sink effect can be expected. by the semiconductor laser using the SiC substrate rather than the semiconductor laser using the sapphire substrate. Also, since the n-side electrode can be provided on the substrate side, the chip mounting technology as applied to the normal semiconductor laser, etc. can be employed. In addition, since the semiconductor laser using the SiC substrate can have the cleavage property by selecting appropriately the face orientation of the SiC substrate, the Fabry-Perot reflection surface can be formed easily in contrast to the semiconductor laser using the sapphire substrate.

In the semiconductor laser using the group III nitride film compound semiconductor in the prior art, the ridge structure must be employed to form the electrode thereon and also the width of the ridge is restricted by the area of the electrode because of the necessity to assure the alignment margin of the electrode.

There is such a problem that, if the width of the ridge exceeds 2 $\mu$m, the optical confinement is weakened in the lateral direction and thus the beam shape is laterally elongated.

A method of performing the optical confinement without the ridge structure or a semiconductor laser in which the current constricting layer is formed is disclosed in Patent Application Publication (KOKAI) Hei 10-294529, Patent Application Publication (KOKAI) Hei 9-232680, and Patent Application Publication (KOKAI). Hei 8-88441.

In Patent Application Publication (KOKAI) Hei 10-294529, an example in which the optical confinement layer is formed on the side of the ridge on the p-type cladding layer and the light is confined by utilizing difference in the refractive index is set forth. It is disclosed to employ InGaN, which has the larger refractive index than the p-type cladding layer, as material of the optical confinement layer. There is such a disadvantage that higher modes are ready to occur if such material having the large refractive index is employed.

In Patent Application Publication (KOKAI) Hei 8-97502, an example in which the current blocking layer is formed in the p-type cladding layer is set forth. The material is InGaN, silicon, etc. This example has a feature to employ the optical absorbing material, but control of the lateral mode is not enoughly performed. In addition, since the photolithography method is employed to form the current path in the current blocking layer, the light emitting portion of the active layer under the current blocking layer is subjected to etching damage if the dry etching is used as the photolithography method, and thus the light emitting characteristic is degraded.

Further, in Patent Application Publication (KOKAI) Hei 9-232680, an example in which the AN, layer is employed as the current constricting layer is set forth, and has a structure to bury both sides of the ridge of the cladding layer by the AlN layer. Such structure cannot help increasing the width of the cladding layer to assure the contact region to the p-side electrode, like the structure shown in FIG. 1B. In addition, the film thickness of the AlN layer is equal to or more than the cladding layer and is thick such as 1 μm. Therefore, the optical confinement is excessively enhanced and thus the higher modes easily occur.

Besides, in Patent Application Publication (KOKAI) Hei 8-88441, an example in which the AlN layer is formed between the p-type cladding layer and the p-type contact layer as the current constricting layer is set forth. However, this example cannot effectively perform the lateral mode control.

SUMMARY OF THE INVENTION

It is an object of the present invention to provide a semiconductor light emitting device in which contact to an electrode is set arbitrarily and large and which is ready to control a lateral mode to a desired width, and a semiconductor light emitting device manufacturing method including the step of forming a lateral mode control structure without damage of a current path of an active layer.

According to the present invention, the AlN layer having a thickness of more than 0 nm but less than 300 nm is inserted into the cladding layer, which is formed on or under the active layer made of the group III–V nitride, as the lateral mode controlling layer. The lateral mode controlling layer also acts as the current constricting later.

The AlN layer can reduce difference in the refractive index from the cladding layer in contrast to the AlGaN layer and is difficult to occur the higher modes. In addition, the oscillation in the basic mode can be achieved by setting the thickness of the AlN layer to more than 0 nm, preferably 1 nm, and the oscillation in other modes can be prevented by setting the thickness of the AlN layer to less than 300 nm. Furthermore, if the thickness of the AlN layer is set to less than 300 nm, suppression of the crack generation can be expected.

Since the AlN layer is formed in the p-type or n-type cladding layer, the current can be restricted by forming only the AlN layer close to the active layer without reduction in the thickness of the cladding layer formed on or under the active layer. Therefore, not only the reduction in the threshold current can be achieved but also there is no necessity that the width of the electrode formed over the cladding layer must be narrowed.

Moreover, according to the present invention, the mask is formed on the cladding layer, then the AlN lateral mode controlling layer is formed on the cladding layer and the mask, and then the opening serving as the current path is formed in the AlN lateral mode controlling layer by removing the mask. Therefore, since the active layer is protected by the mask in forming the AlN layer, no damage is caused in the active layer. In addition, since the AlN layer is not subjected to the wet etching, the width of the opening can be controlled not to be expanded excessively.

Furthermore, according to the present invention, since the structure in which the side surface of the opening of the light emitting region formed in the above cladding layer is risen is employed, the light emitting region of the active layer can be protected by the thick cladding layer in forming the lateral mode controlling layer. In addition, since the optical confinement layer is located close to the active layer on both sides of the light emitting region, the good lateral mode control can be achieved and also spreading of the current in the cladding layer can be suppressed to thus reduce the threshold current.

In the present invention, since the high resistance layers are formed under the lateral mode controlling layer, spreading of the current in the cladding layer can be further suppressed and also the threshold current can be further reduced. In addition, since the method of dry-etching the cladding layer is adopted to form the mesa portion in the cladding layer on the active layer, the current constricting effect can be achieved much more.

DESCRIPTION OF THE PREFERRED EMBODIMENTS

Embodiments of the present invention will be explained with reference to the accompanying drawings hereinafter.
(First Embodiment)

Figure 1A:
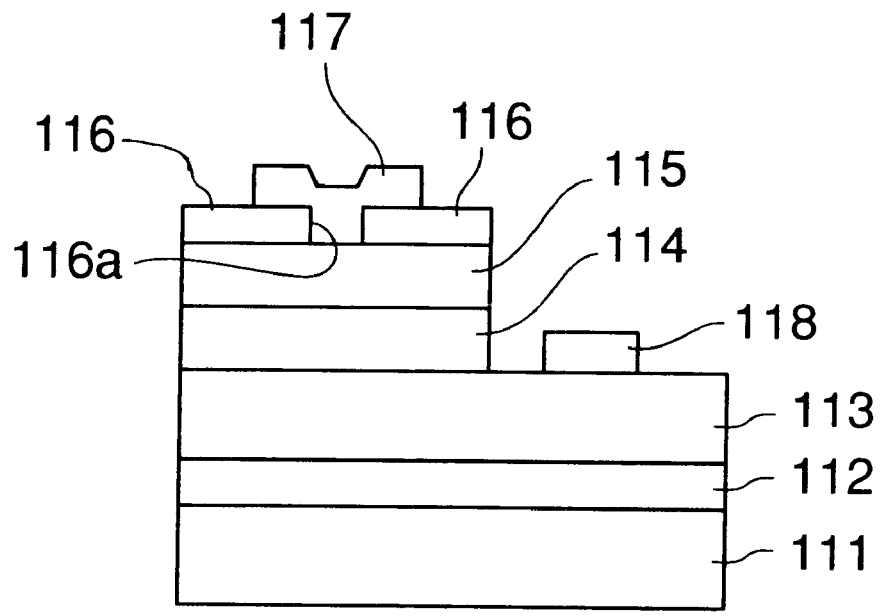
FIGS. 1A and 1B are views showing a semiconductor laser in the prior art.
Figure 1B:
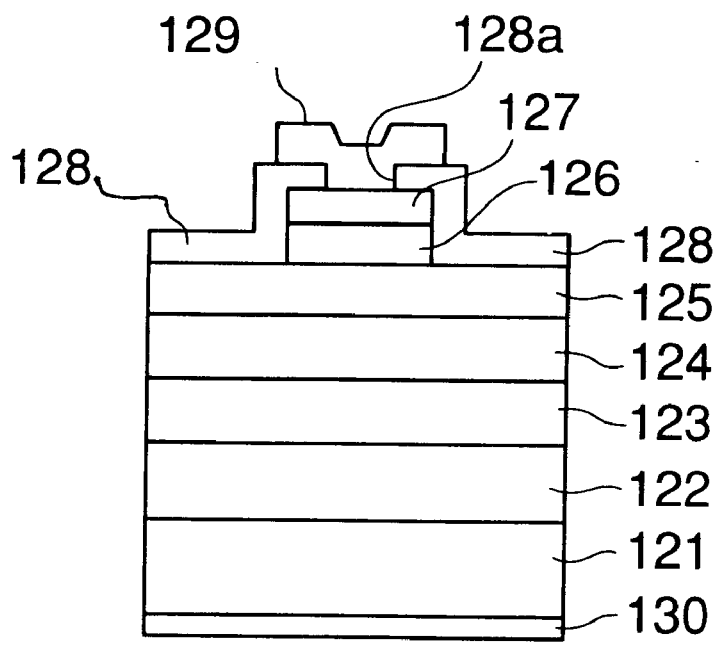
Figure 2:
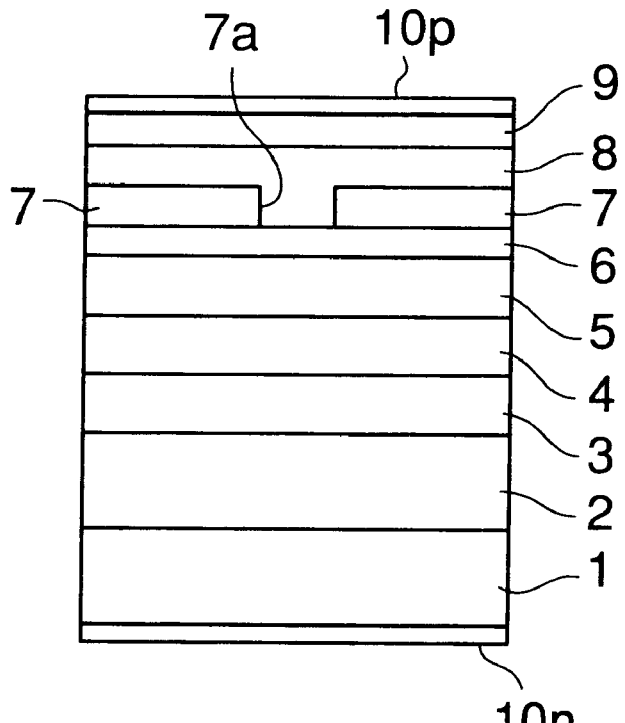
FIG. 2 is a sectional view showing a first semiconductor laser according to a first embodiment of the present invention.

FIG. 2 is a sectional view showing a first semiconductor laser according to a first embodiment of the,present invention.

In FIG. 2, an n-type AlGaN cladding layer 2, an n-type GaN SCH layer 3, an undoped InGaN active layer 4, a p-type GaN SCH layer 5, and a first p-type AlGaN cladding layer 6 are formed in sequence on an SiC substrate 1. Also, an AlN lateral mode controlling layer 7 having a stripe-like opening 7a is formed on the first p-type AlGaN cladding layer 6. In addition, a second p-type AlGaN cladding layer 8 is formed on the p-type AlGaN cladding layer 6 exposed from the opening 7a and on the AlN lateral mode controlling layer 7, and a p-type GaN contact layer 9 is formed on the p-type AlGaN cladding layer 8.

Respective layers on the SiC substrate 1 are formed by executing the crystal growth step using the MOVPE method, etc. three times.

A p-side electrode 10p is formed on the contact layer 9, and an n-side electrode 10n is formed under the SiC substrate 1.

Figure 3:
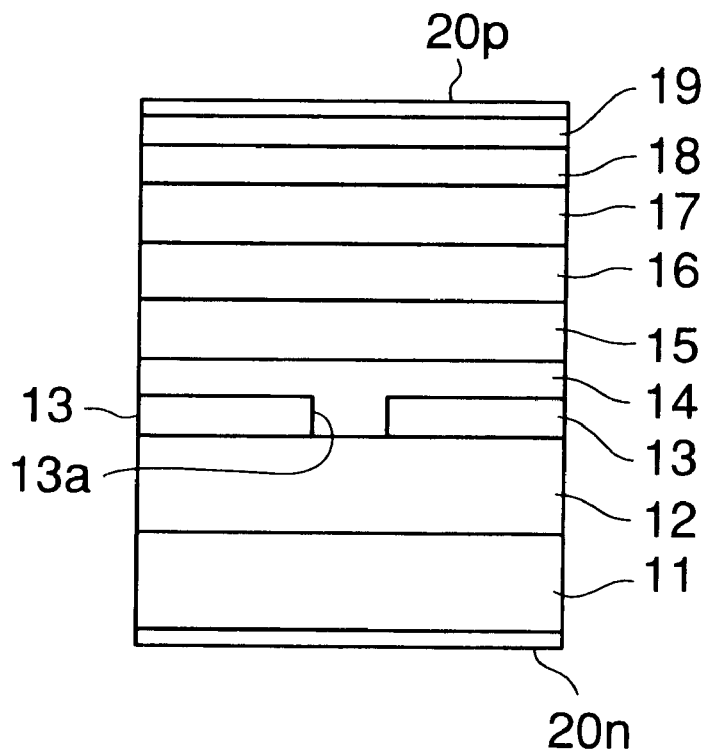
FIG. 3 is a sectional view showing a second semiconductor laser according to the first embodiment of the present invention.

In FIG. 3, a first n-type AlGaN cladding layer 12 and an AlN lateral mode controlling layer 13 are formed in order on an SiC substrate 11, and a stripe-like opening 13a is formed in the AlN lateral mode controlling layer 13. A second n-type AlGaN cladding layer 14 is formed on the AlN lateral mode controlling layer 13 and in the opening 13a. An n-type GaN SCH layer 15, an undoped InGaN active layer 16, a p-type GaN SCH layer 17, a p-type AlGaN cladding layer 18, and a p-type GaN contact layer 19 are formed on the second n-type AlGaN cladding layer 14.

Respective layers on the SiC substrate 11 are formed by executing the crystal growth step using the MOVPE method, etc. three times.

A p-side electrode 20p is formed on the contact layer 19, and an n-side electrode 20n is formed under the SiC substrate 11.

As shown in FIG. 3, if the AlN lateral mode controlling layers 7, 13 having the stripe-like extended openings 7a, 13a are inserted into the P-type or n-type cladding layers 6, 8, 12, 14, difference in the refractive index occurs between the AlN lateral mode layers 7, 13 and the cladding layers 6, 8, 12, 14 respectively. Thus, the light can be confined at a position corresponding to the stripe.

Accordingly, since the confinement effect can be achieved by the AlN lateral mode controlling layers 7, 13 without the ridge structure, the contact to the p-side electrodes 10a, 20a can be increased by selecting arbitrarily an interval between the AlN lateral mode controlling layers 7, 13 and also the lateral mode can be controlled to a desired width.

At this time, thicknesses of the AlN lateral mode controlling layers 7, 13 is set larger 0 nm but less than about 300 nm. This is because the basic mode oscillation can be achieved by setting the thickness larger than 0 nm, preferably 1 nm, and the multi mode oscillation can be prevented by setting the thickness to less than 300 nm. In addition, an effect for suppressing generation of the crack in the AlN lateral mode controlling layers 7, 13 can also be expected by setting the film thickness in such range.

As shown in FIGS. 2 and 3, the AlN lateral mode controlling layers 7, 13 have the effect if such layer is inserted into any one of the p-type cladding layer and the n-type cladding layer and, although not shown, such layer may be inserted into both layers. In case such layer is inserted into both the p-type cladding layer and the n-type cladding layer, an aspect ratio of the beam shape can be set close to 1 and thus the semiconductor laser becomes more suitable for the light source for the optical disk, etc.

Figure 4A:
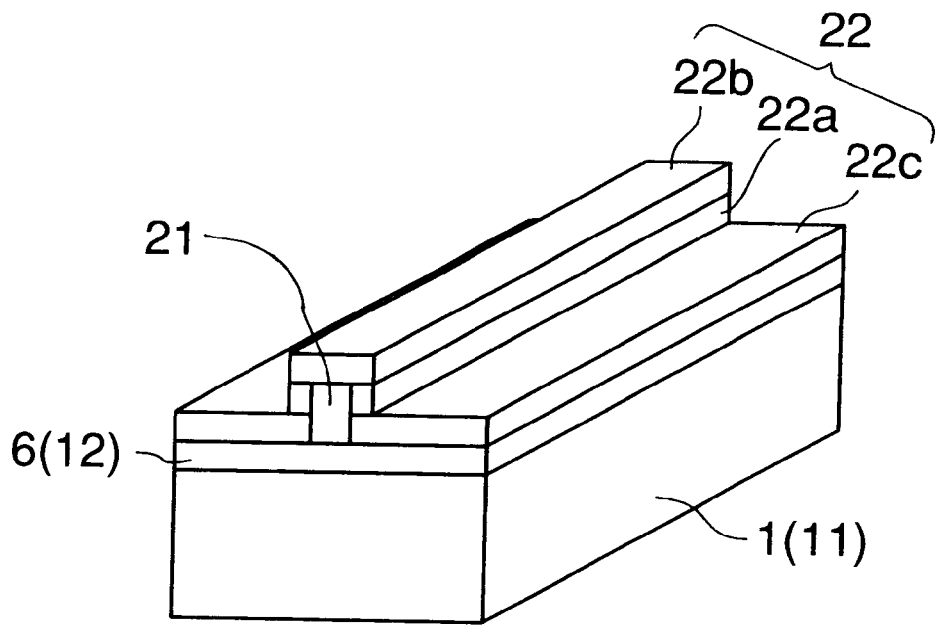
FIGS. 4A and 4B are perspective views showing a method of forming a lateral mode controlling layer of the semiconductor laser according to the first embodiment of the present invention.
Figure 4B:
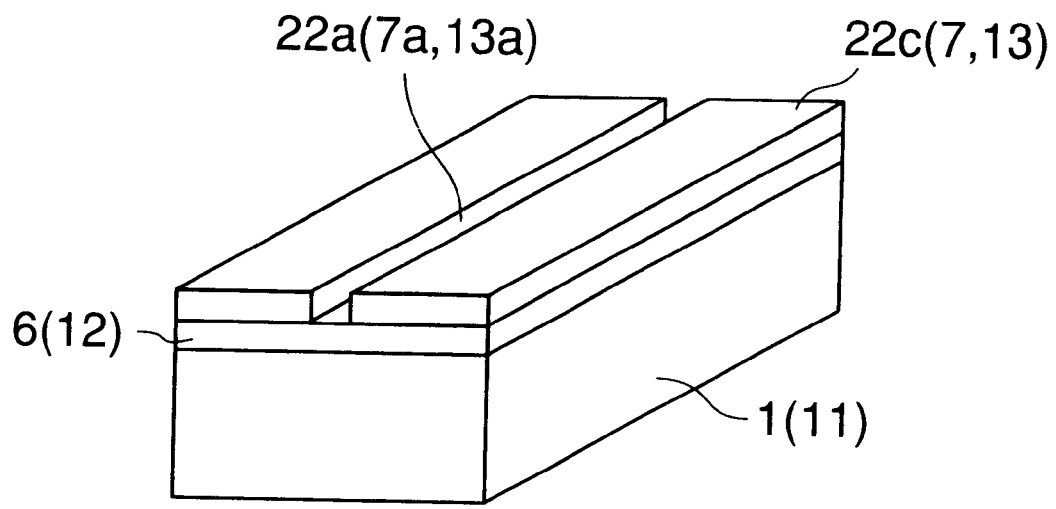

In addition, as shown in FIG. 2, if the AlN lateral mode controlling layer 7 is provided between the p-type cladding layers 6, 8, an effect of restricting the current can also be expected. Thus, since carriers injected from the p-side electrode lop are not spread in the neighborhood of the active layer, an effect of reducing the threshold current can also be achieved. FIGS. 4A and 4B show formation of the AlN lateral mode controlling layers 7, 13 and formation of the openings 7a, 13a shown in FIGS. 2 and 3.

First, as shown in FIG. 4A, a stripe-like mask 21 made of $SiO_2$, etc. is formed on the cladding layer 6 (12) formed on the substrate 1 (11). Then, an AlN layer 22 constituting the lateral mode controlling layer 7 (13) is grown on an overall surface by the MOVPE method, the ECR sputtering method, etc. so as to cover level difference between the stripe-like mask 21 and the cladding layer 6 (12). In this case, the AlN layer 22 is formed thin on the side surface portion of the mask but thick on upper surfaces of the cladding layer 6 (12) and the mask 21.

Accordingly, when the mask 21 is immersed in an etchant to etch the mask 21, e.g., the hydrofluoric acid, a thin AlN layer 22a on the side surface of the mask 21 and a thick AlN layer 22b on the upper surface of the mask 21 are lifted off, and thus an AlN layer 22c remains only on the cladding layer 6 (12). The AlN layer 22c is used as the lateral mode controlling layer 7 (13).

If a thickness of the mask 21 is more than 1.5 times the thickness of the AlN layer 22, the thin AlN layer 22a is formed on the side walls of the mask 21. If a ratio of the film thicknesses is set larger than 5 times, the AlN layer 22a on the side walls can be made sufficiently thin. Thus, linearity of edges of a stripe-like opening 22a (7a, 13a) can be improved.

In addition, if an interval (opening width) of regions from which the AlN layer 22 is removed is set within 1 mm, preferably 300 μm, the stress in the AlN layer 22 can be dispersed and thus generation of the crack in the AlN layer 22 can be suppressed.

If the step of forming the lateral mode controlling layer as mentioned above is adopted, immediately upper portions or immediately lower portions of the light emitting portions of the active layers 4, 16 can be protected by the mask 21. Therefore, the light emitting portions are never exposed to the plasma atmosphere in succeeding etching or layer growth and thus the damage of the light emitting portions can be prevented.

Meanwhile, a following problem is caused when the normal photolithography method is used to form the stripe-like opening 22a in the AlN layer 22.

That is, if the AlN layer is etched by using phosphoric acid, for example, in the photolithography, an etching rate of the phosphoric acid against the AlN layer is large in the a-axis direction rather than the c-axis direction. Therefore, an amount of side etching of the AlN layer is increased and thus it becomes difficult to control the width of the opening 22a. Also, if the opening is formed by etching the AlN layer by virtue of the dry etching method, areas located immediately on or under the active layers 4, 16 are dry-etched. Therefore, such a problem has arisen that, since the influence of the etching damage comes up to the light emitting portions of the active layers 4, 16, the light emitting characteristic is deteriorated.

Further, if an $Al_xGa_{1-x}N$ layer is used as the cladding layer of the GaN semiconductor laser, normally it is employed in the range of $0<x\leq0.2$. In this case, such another problem has arisen that, if an AlN layer is grown on such $Al_xGa_{1-x}N$ layer, the strong tensile stress is applied to the AlN layer due to the lattice mismatching to generate the crack.

These problems can be overcome by the foregoing patterning method.

Next, steps of forming the semiconductor laser by using the above-mentioned patterning method for the AlN layer will be explained hereunder.

Figure 5A:
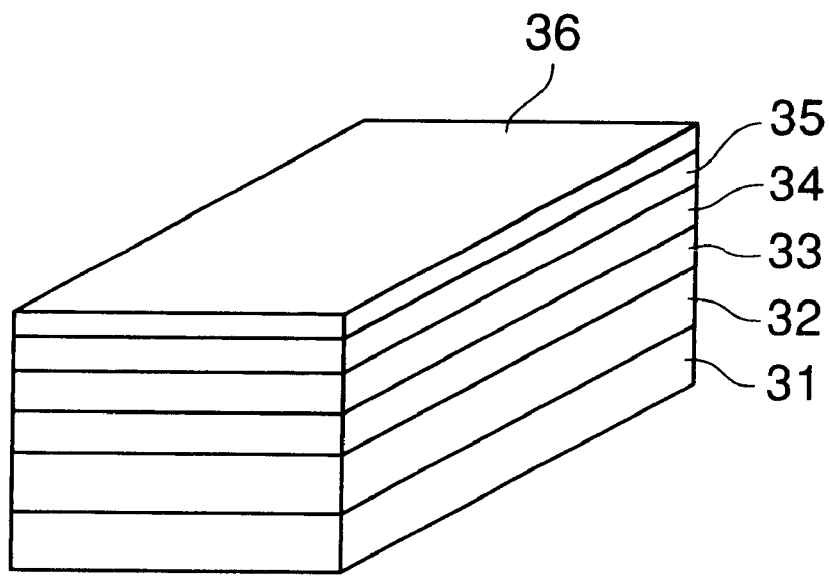
FIGS. 5A to 5F are perspective views showing steps of forming the first semiconductor laser according to the first embodiment of the present invention.

To begin with, as shown in FIG. 5A, an n-type cladding layer 32 made of n-type AlGaN, an n-type SCH layer 33 made of n-type GaN, an active layer 34 made of undoped InGaN, a p-type optical confinement layer 35 made of p-type GaN, and a first p-type cladding layer 36 made of p-type AlGaN are formed in sequence on a (0001) face of a substrate 31 made of 6H—SiC by using the MOVPE method to have a thickness of 1500 nm, 100 nm, 10 nm, 100 nm, and 50 nm respectively.

Figure 5B:
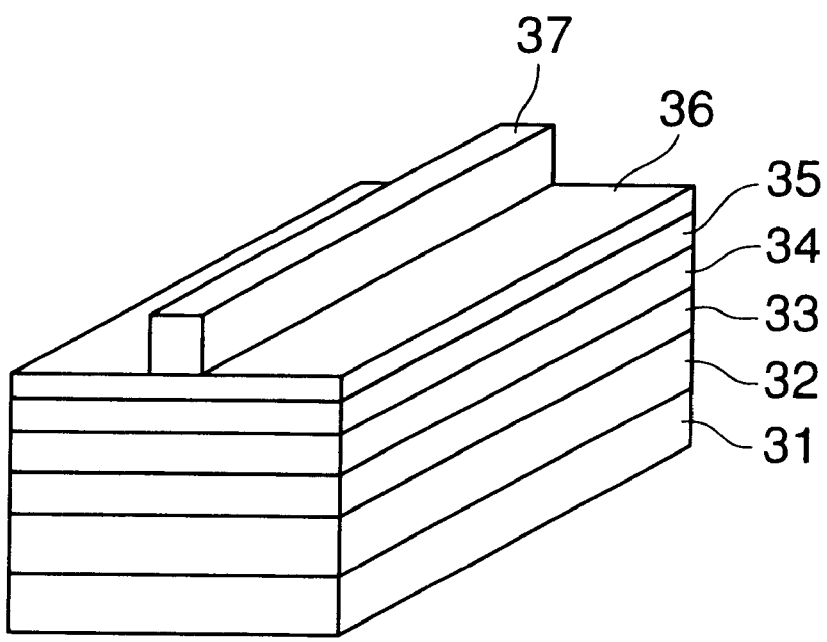

Then, an SiO$_2$ film 37 is formed on the first p-type cladding layer 36 by the thermal CVD method to have a thickness of 5 to 2000 nm. Then, as shown in FIG. 5B, the SiO$_2$ film 37 is patterned by the photolithography method to remain stripe shapes each having a width of 0.1 to 2 μm. In this case, although not shown particularly, a plurality of stripe-like SiO$_2$ films 37 are formed at a pitch of 10 to 1000 μm.

Figure 5C:
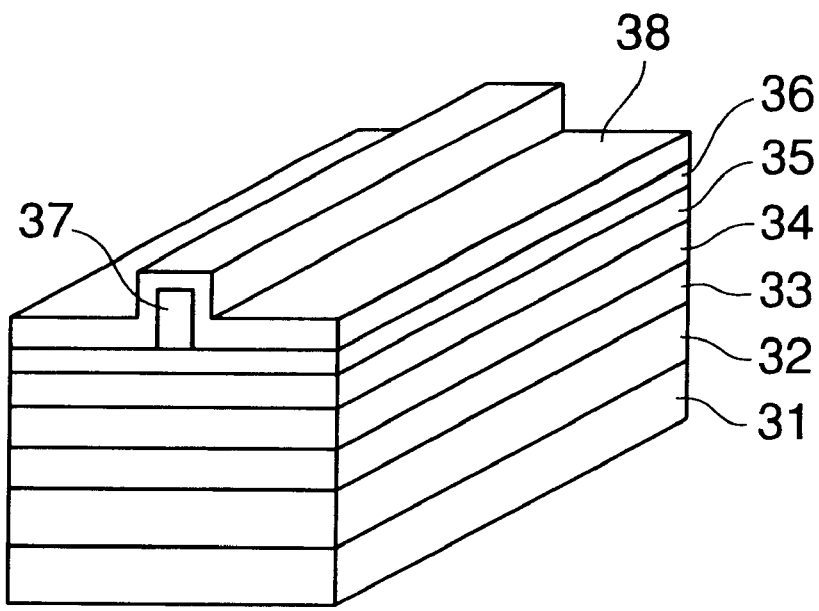

Then, the SiO$_2$ film 37, etc. are washed in a pure water. Then, as shown in FIG. 5C, under the condition that the substrate 31 is heated at room temperature to 500° C., preferably the temperature of 100° C. to 400° C., an AlN layer 38 is formed on the first p-type cladding layer 36 and the stripe-like SiO$_2$ films 37 by the ECR sputtering method to have a thickness of more than 0 nm, preferably 1 nm, but less than 300 nm.

Figure 5D:
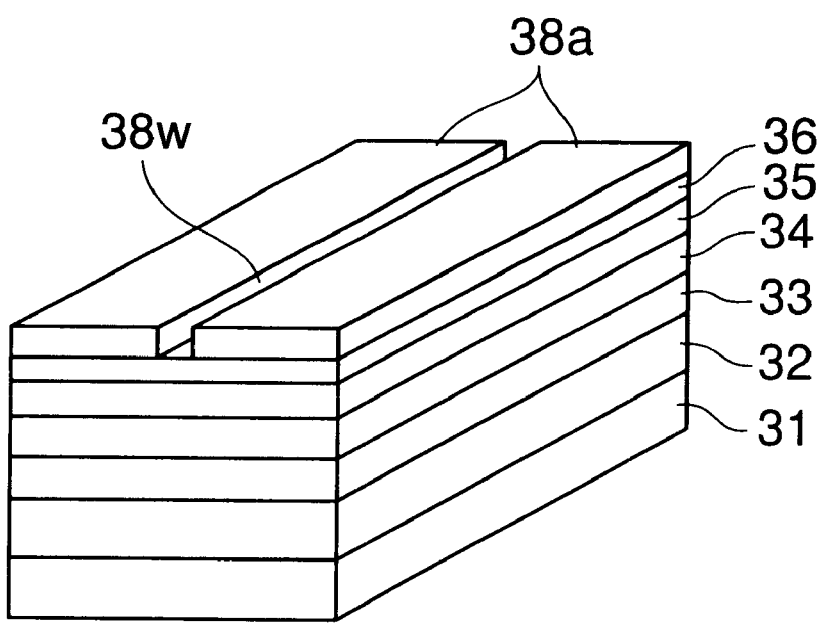

Then, as shown in FIG. 5D, if the substrate 31 and respective layers formed thereon are immersed in a hydrofluoric acid solution for 30 seconds to five minutes, the SiO$_2$ film 37 is removed and the AlN layer 38 formed on the SiO$_2$ film 37 is lifted off, and thus an opening 38w having a width of 1 to 2 μm is formed in the AlN layer 38. The AlN layer 38 having the opening is used as a lateral mode controlling layer 38a. In some case, such lift-off is conducted in the pure water washing or the ultrasonic cleaning after the hydrofluoric acid process.

The lift-off AlN layer 38 is a thin portion on the side portions of the SiO$_2$ film 37 and a thick portion on the SiO$_2$ film 37.

Figure 5E:
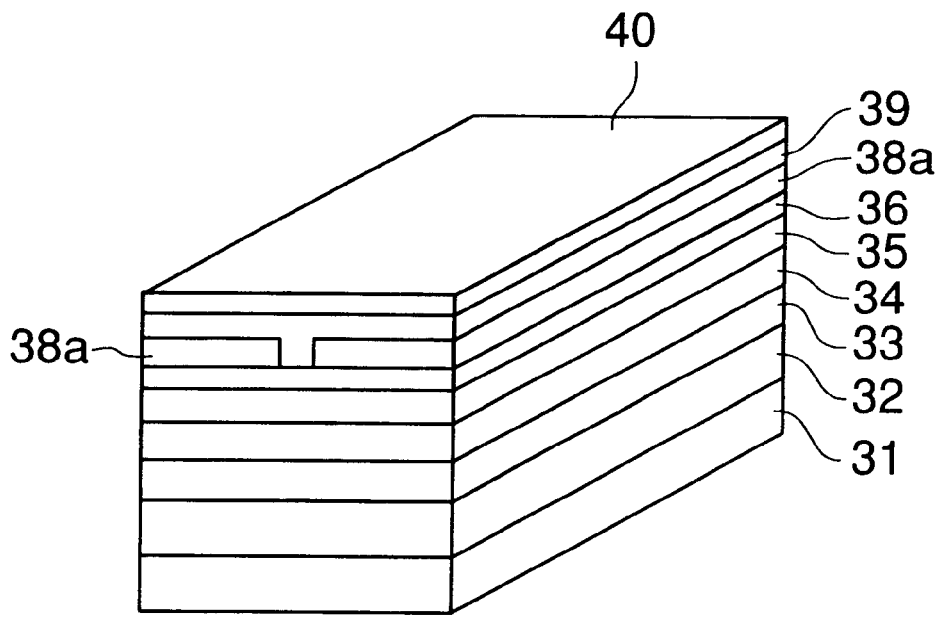

Then, as shown in FIG. 5E, a second p-type cladding layer 39 which is formed of p-type AlGaN and has a thickness of 500 nm and a contact layer 40 which is formed of p-type GaN and has a thickness of 50 nm are formed in sequence on the lateral mode controlling layer 38a and in the opening 38w by the MOVPE method.

Figure 5F:
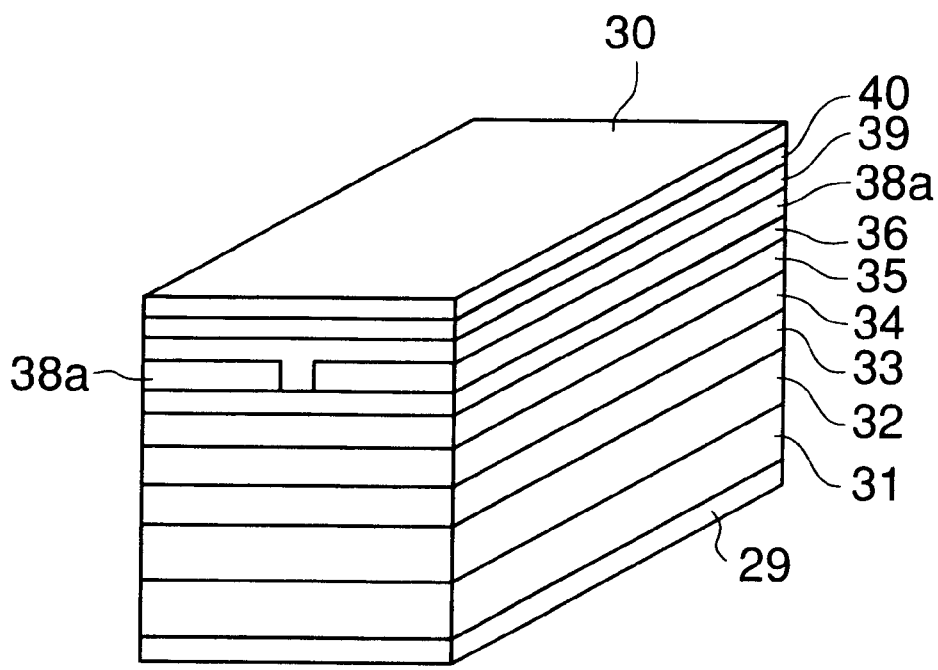

Then, as shown in FIG. 5F, nickel (Ni) and gold (Au) are formed in order on the contact layer 40 as a p-side electrode 30. by the evaporation method. Also, titanium (Ti) and aluminum (Al) are formed on the lower surface of the substrate 41 in order as an n-side electrode 29 by the evaporation method.

Thereafter, the substrate 41 and respective semiconductor layers formed thereon are cleft vertically to the extending direction of the opening 38w, whereby a resonator is formed. Then, the laser can be completed via the chip separating step and the bonding step.

In such semiconductor laser, since the AlN lateral mode controlling layer 38a is formed to have a thickness of more than 0 nm but less than 300 nm, the optical confinement in the lateral direction can be achieved effectively to control the lateral mode, and generation of the higher modes can be prevented.

Also, since the AlN lateral mode controlling layer 38a is patterned by the lift-off method, the damage of the active layer and its neighboring areas caused by the dry etching method can be prevented in advance. Also, a dimension of the opening 38w can be formed with good precision by preventing rapid side etching of the AlN layer 38 caused by the wet etching method.

In addition, since the AlN layer 38 is formed by the ECR sputtering method, single crystal of the AlN layer 38 can be grown while keeping the substrate temperature at the lower temperature than the case where the AlN layer 38 is formed by the MOVPE method. Thus, thermal degradation of the active layer 34 can be prevented and also the crack generation of the AlN layer 38 due to difference in thermal expansion coefficients between the AlN layer 38 and the underlying layer can be suppressed.

In case the AlN layer 38 is formed by the sputtering method, the substrate 31 is exposed to the plasma. In this case, since the lift-off mask (SiO$_2$ layer) 37 is formed at a position which is located immediately on or under the light emitting portion of the active layer 34, the mask 37 can act as a protection film for the active layer 34 to thus prevent generation of the damage.

Furthermore, the ECR sputtering method is employed as an example of the sputtering method. But other sputtering methods may be employed such as the normal sputtering method using AlN as a target, the reactive ion sputtering method using aluminum as a target and using a nitrogen gas, etc.

Next, another example of the lift-off method used in the case where the AlN layer 38 is patterned will be explained hereunder.

Figure 6A:
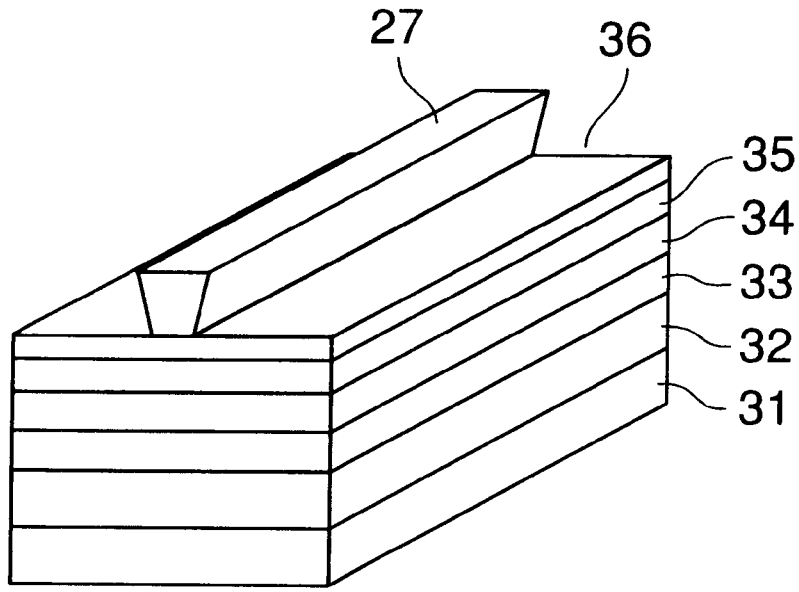
FIGS. 6A and 6B are perspective views showing another steps of forming a lateral mode control layer the first semiconductor laser according to the first embodiment of the present invention.
Figure 6B:
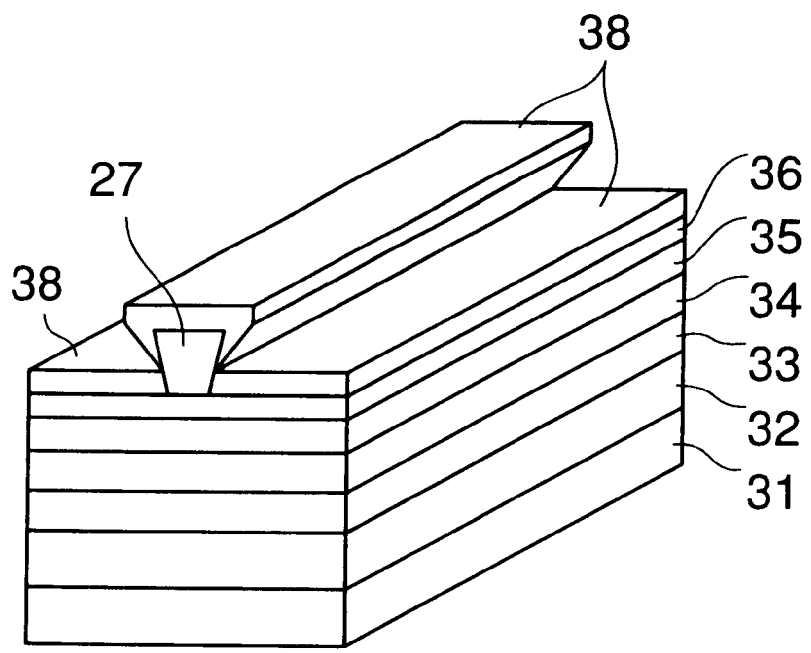

FIGS. 6A and 6B are perspective views showing another example of the lift-off method, and the same symbols as those shown in FIGS. 4A and 4B and FIGS. 5A to 5F denote the same elements. In this example, a different respect from FIG. 5B is that a sectional shape of the stripe-like SiO$_2$ film (mask 37) has a reverse mesa shape.

First, as shown in FIG. 6A, the SiO$_2$ film 27 of 2 to 800 nm thickness is formed on the first p-type cladding layer 36 by the thermal CVD method such that a phosphorus density can be reduced from the lower side to the upper side. Then, the SiO$_2$ film 27 is left like a stripe by the hydrofluoric acid solution while using resist (not shown) as a mask. In this case, a mixed gas of silane and the water is used as a source gas to form the SiO$_2$ film 27, and phosphine (PH$_3$) is used as a source gas of phosphorus.

It has been known that an etching rate of the SiO$_2$ film 27 to the hydrofluoric acid solution depends on a concentration of the impurity such as phosphorus, etc. Accordingly, if the SiO$_2$ film 27 is formed by the CVD method such that a phosphorus concentration of the lower layer portion is set higher and the phosphorus concentration is reduced toward the upward direction, the etching rate to the hydrofluoric acid solution is accelerated in the lower layers. As a result, the stripe-like SiO$_2$ film 27 has the reverse mesa shape.

Then, the resist is removed and-then, as shown in FIG. 6B, the AlN layer 38 is formed by the ECR sputtering method to have a thickness of more than 0 nm, preferably 1 nm, but less than 300 nm. In this case, since the stripe-like SiO$_2$ film 27 has a reverse mesa shape, the thickness of the AlN layer 38 becomes extremely thin on the side walls of the SiO$_2$ film 27 and thus the lift-off of the AlN layer 38 formed on the SiO$_2$ film 27 becomes easy.

Accordingly, it is possible to perform the lift-off even if the thickness of the SiO$_2$ film 27 is not formed so thick rather than the thickness of the AlN layer 38.

In the above example, the etching rate of the SiO$_2$ film 27 is changed by changing the phosphorus concentration in the SiO$_2$ film 27 along the thickness direction. In addition, the etching rate can be changed. in the thickness direction by using an SiON film in place of SiO$_2$ and then changing a nitrogen concentration along the thickness direction. In this case, since the etching rate is reduced as a contained amount of nitrogen is increased, the sectional shape has the reverse stripe shape after the SiON film is formed like the stripe shape by the photolithography method if the contained amount of nitrogen is increased with the progress of the growth of the SiON film. A mixed gas of silane, ammonium, and oxygen is employed as a source gas of the SiON film.

Figure 7A:
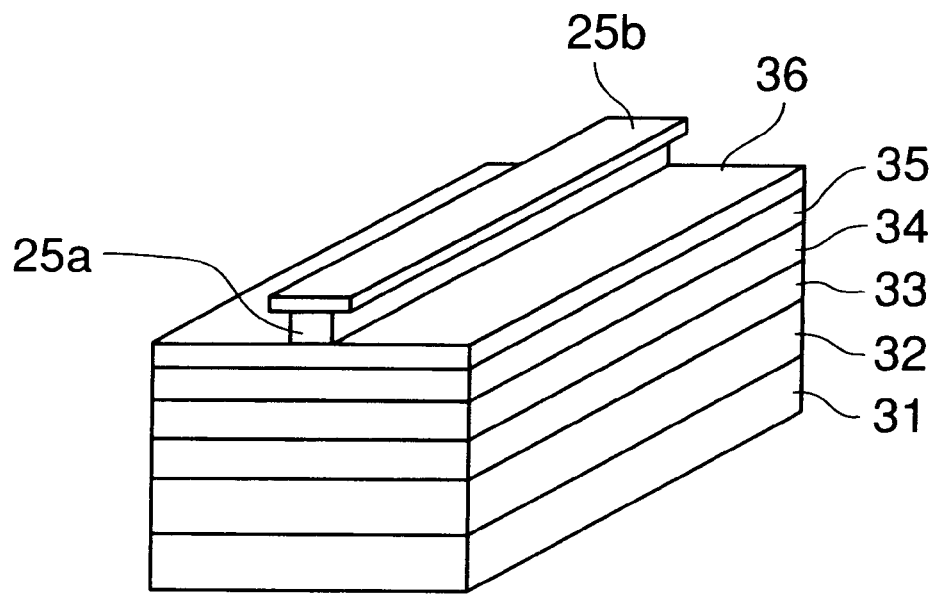
FIGS. 7A and 7B are perspective views showing still another steps of forming the lateral mode control layer the first semiconductor laser according to the first embodiment of the present invention.

Next, still another example of the lift-off method will be explained with reference to FIGS. 7A and 7B hereunder. In this example, a different respect from FIGS. 6A and 6B is that a sectional shape of the stripe-like SiO$_2$ film is formed as a T-shape.

First, as shown in FIG. 6A, the first SiO$_2$ film 25a is formed on the first p-type cladding layer 36 by the sputtering method to have a thickness of 1 to 400 nm. Then, the second SiO$_2$ film 25b is formed on the first SiO$_2$ film 25a by the thermal CVD method to have a thickness of 1 to 400 nm.

Then, the first and second SiO$_2$ films 25a, 25b are etched by the hydrofluoric acid solution by using the stripe-like resist (not shown) as a mask, and then the resist is removed. In this case, since the first SiO$_2$ film 25a formed by the sputtering method has the large etching rate to the hydrofluoric acid solution rather than the second SiO$_2$ film 25b formed by the CVD method, the T-shaped sectional shape can be obtained, as shown in FIG. 7A. Thus, the lift-off mask 25 is formed by the first and second SiO$_2$ films 25a, 25b formed as above.

Figure 7B:
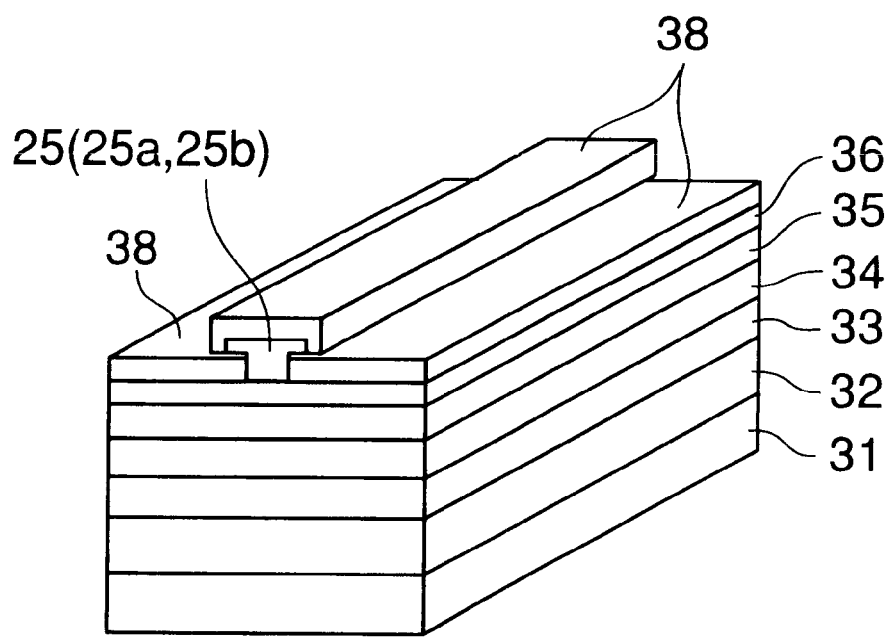

In turn, as shown in FIG. 7B, if the AlN layer 38 is formed by the ECR sputtering method to have a thickness of more than 0 nm, preferably 1 nm, but less than 300 nm, the thickness of the AlN layer 38 is reduced extremely small on the side walls of the lift-off mask 25 having the T-shaped sectional shape and thus the lift-off of the lift-off mask 25 becomes easy.

In this example, the etching rate of the upper portion and the lower portion of the lift-off mask is changed by changing the method of forming the SiO$_2$ films 25a, 25b. However, the etching rate to the etchant may be increased in the lower layer by changing the phosphorus concentration in the upper portion and the lower portion of the SiO$_2$ film or by forming the SiO$_2$ film and an SiN film.

In the above first embodiment, the AlN layer 38 is formed by the ECR sputtering method. But the MOVPE method may be employed if such method is allowed based on conditions for the thermal treatment.

Also, in the above first embodiment, the lateral mode control layer is formed in the cladding layer. But the similar effect can be achieved even if such layer is inserted between the SCH layer and the cladding layer. In addition, such layer is not formed on the p-type cladding layer side, but is formed the n-type cladding layer side, otherwise such layer may be formed. on both sides. Besides, the similar effect can be achieved by inserting such layer into the SCH layer or between the SCH layer and the active layer.

In the above example, the InGaN layer is used as the active layer. But other group III nitride compound may be employed, and a multi-layered quantum well structure may be employed instead of the single layer.

Moreover, in the above example, the example in which the group III nitride compound is used as the group III–V compound is shown. But the present invention can be applied to other group III–V compound using the AlN layer.
(Second Embodiment)

In the first embodiment, the cladding layer is formed between the active layer and the AlN lateral mode control layer. If a distance between the active layer and the AlN lateral mode control layer, i.e., the thickness of the cladding layer, is in excess of 0.1 $\mu$m, the current passing through the opening of the AlN lateral mode control layer spreads laterally in the cladding layer to thus cause the increase of the threshold current of the semiconductor laser. On the contrary, if the thickness of the cladding layer between the active layer and the AlN lateral mode control layer is formed thin, the active layer is damaged in forming the AlN lateral mode control layer, or formation of the AlN film cannot be satisfactorily controlled. As a result, there is a possibility that the surface morphology of the AlN lateral mode control layer is degraded.

Therefore, in a second embodiment, a semiconductor laser which can performed the lateral mode control not to increase the threshold current and a method of manufacturing the same will be explained.

Figure 8A:
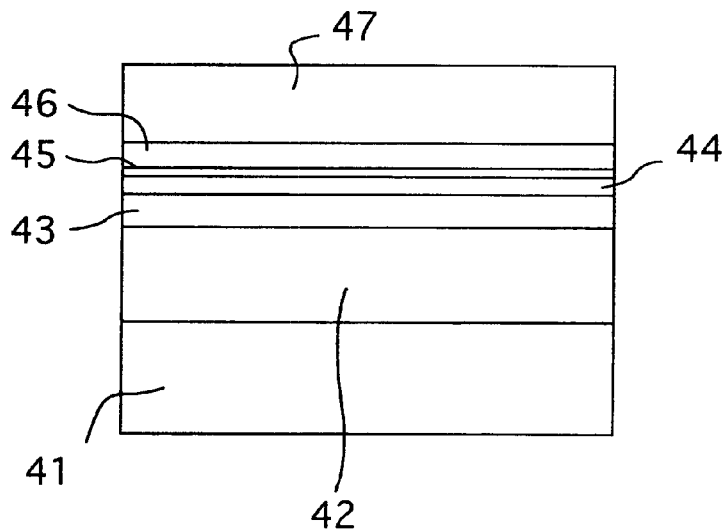
FIGS. 8A to 8G are sectional views showing steps of forming a semiconductor laser according to a second embodiment of the present invention.

First, as shown in FIG. 8A, an n-type (n–) $Al_{0.09}Ga_{0.91}N$ cladding layer 42 of 1.5 $\mu$m thickness, an n-GaN SCH layer 43 of 100 nm thickness, an undoped InGaN multiple quantum well (MQW) active layer 44, a p-type (p--) $Al_{0.18}Ga_{0.82}N$ electron blocking layer 45 of 20 nm thickness, a p-GaN SCH layer 46 of 100 nm thickness, and a first p-$Al_{0.09}Ga_{0.91}N$ cladding layer 47 which has a thickness of more than 0 $\mu$m and less than 5 $\mu$m are grown in sequence on a (0001) face of an n-type silicon carbide (SiC) substrate 41 by using the MOCVD method respectively.

The multiple quantum well active layer 44 has a structure in which an $In0.15Ga_{0.85}N$ well layer is put between four $In_{0.03}Ga_{.97}N$ barrier layers respectively. The barrier layer has a thickness of 5 nm and the well layer has a thickness of 4 nm.

Figure 8B:
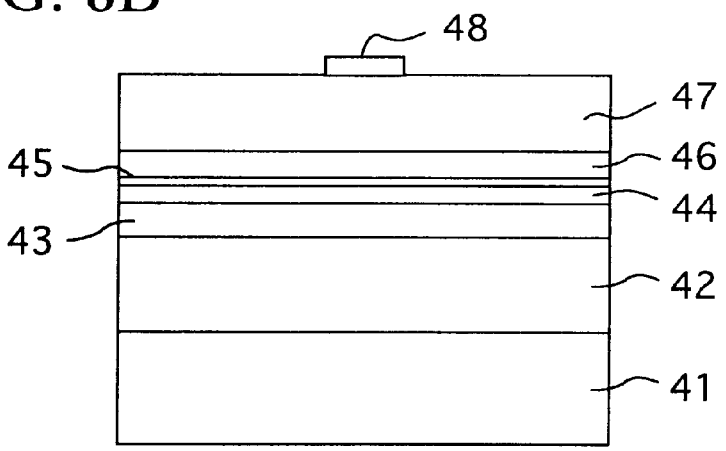

Then, an SiO$_2$ film 48 is formed on the first p-$Al_{0.09}Ga_{0.91}N$ cladding layer 47 by the thermal CVD method to have a thickness of 300 nm. Then, as shown in FIG. 8B, the SiO$_2$ film 48 is patterned into a stripe shape which has a width of 0.5 to 2.0 $\mu$m, e.g., 1.5 $\mu$m, by the photolithography method. This stripe shape is used as a mask.

Figure 8C:
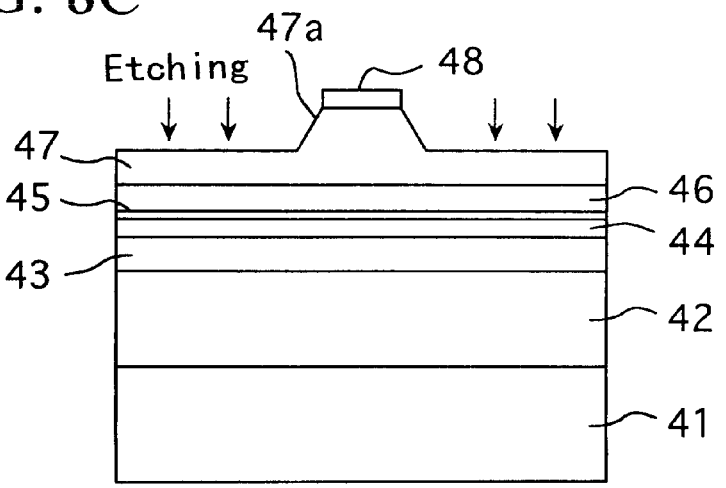

After this, a region of the first p-$Al_{0.09}Ga_{0.91}N$ cladding layer 47, which is not covered with the mask 48, is etched. This etching may be performed up to a depth, e.g., 0.2 $\mu$m, at which a part of the first p-$Al_{0.09}Ga_{0.91}N$ cladding layer 47 remains, as shown in FIG. 8C, otherwise a depth which reaches the n-$Al_{0.09}Ga_{0.91}N$ cladding layer 42, otherwise a depth between the first p-$Al_{0.09}Ga_{0.91}N$ cladding layer 47 and the n-$Al_{0.09}Ga_{0.91}N$ cladding layer 42.

Since the light emitting region of the active layer 44 is protected by the mask 48 in etching, no problem is caused particularly even if the active layer 44, etc. are damaged on both sides of the mask 48 by. the etching of the first p-$Al_{0.09}Ga_{0.91}N$ cladding layer 47. According to this etching, a mesa portion 47a of the first p-$Al_{0.09}Ga_{0.91}N$ cladding layer 47 is formed under the mask 48 and also an upper surface of the mesa portion 47a has a stripe shape having a width of 0.5 to 2.0 $\mu$m.

Figure 8D:
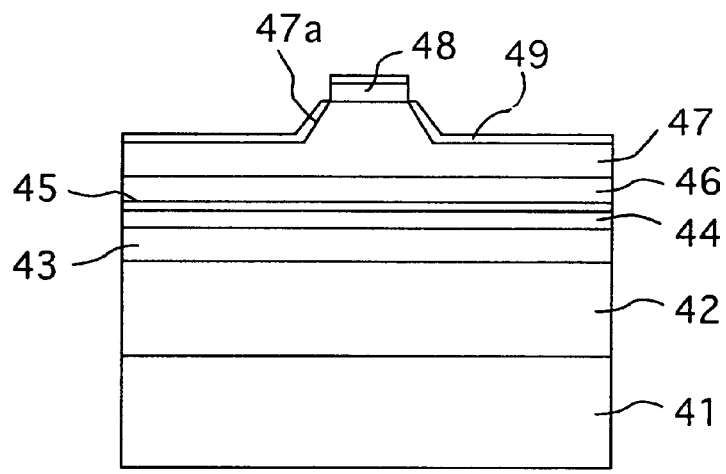

Then, as shown in FIG. 8D, an insulating AlN layer 49 of 20 nm thickness is formed on the mask 48 and the first p-$Al_{0.09}Ga_{0.91}N$ cladding layer 47 by the ECR sputtering method.

Figure 8E:
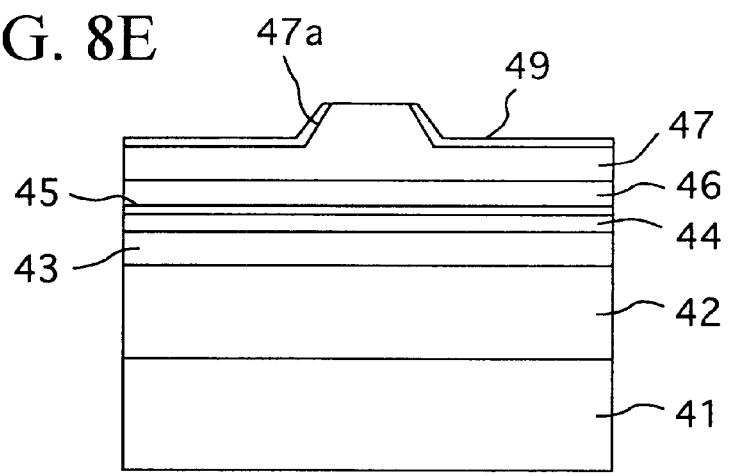
Figure 8F:
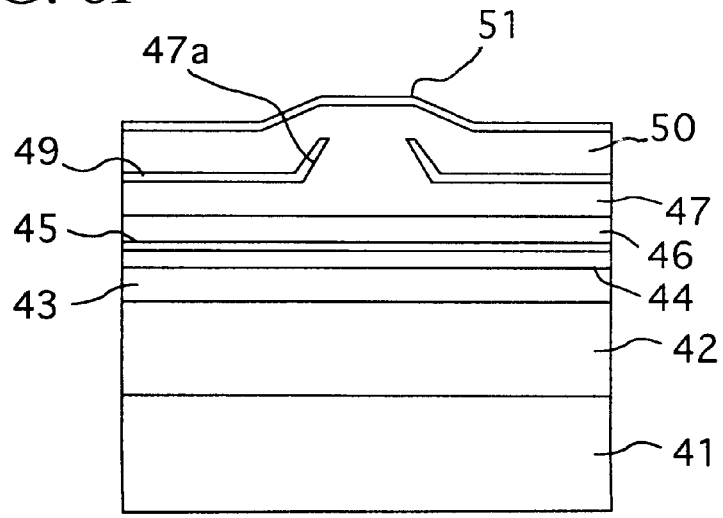

Then, the lift-off of the AlN layer 49 on the mask 48 is carried out by etching the mask 48 on the mesa portion 47a by means of the hydrofluoric acid, and the AlN layer 49 left on the side of the mesa portion 47a is used as the lateral mode controlling layer. Thus, as shown in FIG. 8E, the upper surface of the mesa portion 47a is exposed from the AlN layer 49, a current passing opening is formed in the AlN layer 49, and the AlN layer 49 is raised along the side surfaces of the mesa portion 47a. A maximum angle of the raised portion relative to the upper surface of the active layer 44 is larger than 30° but smaller than 150°. An angle of the raised portion of the AlN layer 49 relative to the active layer 44 is different according to the position.

Then, the second crystal growth is performed by the MOCVD method.

That is, as shown in FIG. 8E, a second p-$Al_{0.09}Ga_{0.91}N$ cladding layer 50 and a p-GaN contact layer 51 are formed on the AlN layer 49 and the mesa portion 47a to have a thickness of 10 nm to 3000 nm (e.g., 700 nm) and 0.05 μm respectively. In this case, the cladding layer 50 and the contact layer 51 are crystal-grown on the AlN layer 49.

An insulating layer formed of AlGaN, GaN, or $Si_3N_4$ may be grown in place of the AlN layer 49 by the MOCVD or the ECR. The cladding layer 50 formed on the film is crystallized.

Figure 8G:
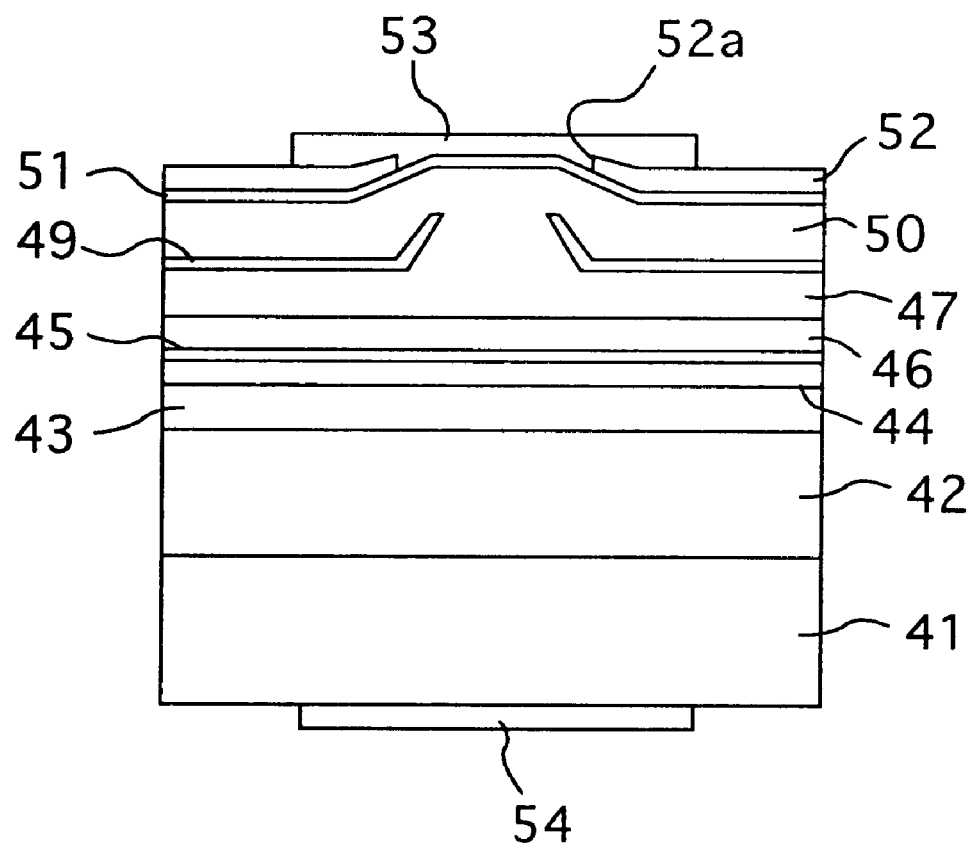

Then, as shown in FIG. 8G, an insulating film 52 made of $SiO_2$ is formed on the contact layer 51, and then an opening 52a is formed over the mesa portion 47a by patterning the insulating film 52 by virtue of the photolithography method. Then, a p-side electrode 53 connected to the contact layer 51 is formed in the opening 52a and on the peripheral insulating film 52.

Then, an n-side electrode 54 is formed under the SiC substrate 41.

Here the p-side electrode 53 may be formed on the contact layer 51 without the step of forming the insulating film on the contact layer 51. In this case, the current supplied to the contact layer 51 is restricted only by the AlN layer 49.

In the above steps, the first cladding layer 47 is formed over the active layer 44, and then the film thickness of the first cladding layer 47 on the light emitting region is reduced and also the mesa portion 47a is formed on the light emitting region by etching the first cladding layer 47 on both sides of the light emitting region.

Figure 9:
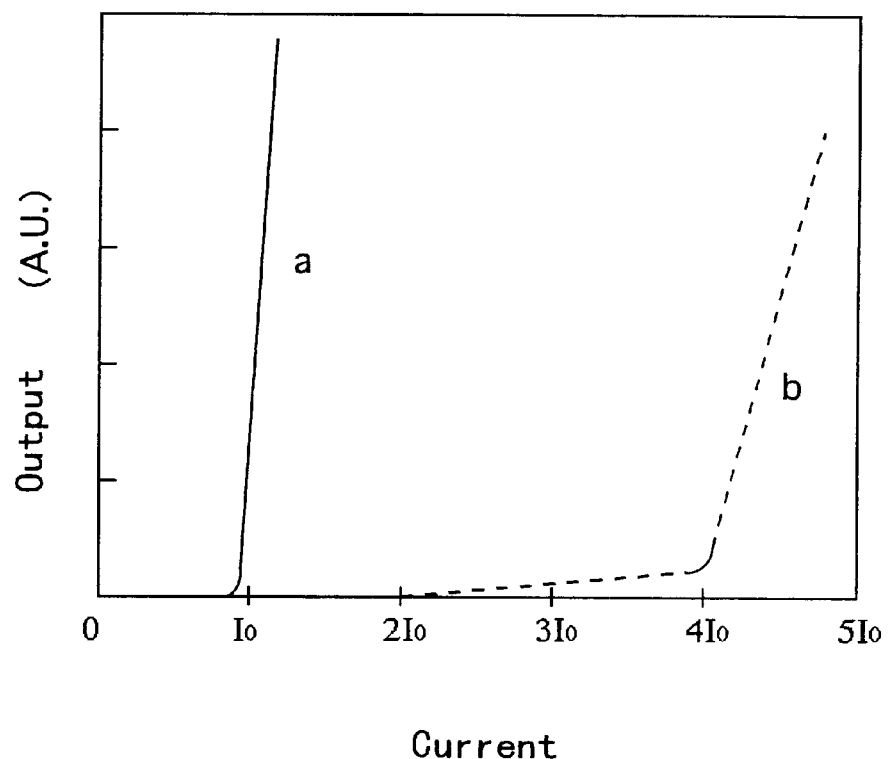
FIG. 9 is a graph showing the characteristics of the semiconductor laser according to the first embodiment of the present invention and the semiconductor laser according to the second embodiment of the present invention.

Therefore, even if the first cladding layer 47 on the light emitting region of the active layer 44 is formed thick, the current flowing through the mesa portion 47a is difficult to spread to both sides, so that reduction in the threshold value of the semiconductor laser can be achieved. A solid line a in FIG. 9 denotes the current output characteristic of the semiconductor laser according to the second embodiment, and a broken line b in FIG. 9 denotes the current-output characteristic of the semiconductor laser according to the first embodiment. In FIG. 9, the threshold value of the semiconductor laser according to the second embodiment is reduced smaller than the semiconductor laser according to the first embodiment.

Also, since the first cladding layer 47 on the light emitting region is formed thick, the active layer 44 in the light emitting region is never subjected to the damage when the AlN layer 49 is formed on the light emitting region by the ECR. As a result, control of the film formation of the AlN layer 49 can be facilitated and the surface morphology is not degraded.

In addition, in the second embodiment, since the current is restricted by the AlN layer 49 like the first embodiment, a contact area between the upper electrode and the contact layer 51 can be increased and thus a contact resistance can be reduced. Therefore, an device resistance can be lowered.

A sapphire substrate, a GaN substrate, etc. may be employed in place of the above SiC substrate. Also, composition and thickness of the buffer and the cladding layer, composition and thickness of the active layer, the number of well layers, etc. are not limited to above structure if these layers are formed by AlGaInN material.

Further, material of the mask 48 is not limited to $SiO_2$, and other insulating film such as SiON may be employed.

(Third Embodiment)

FIGS. 10A to 10H are sectional views showing steps of forming a semiconductor laser according to a third embodiment of the present invention.

Figure 10A:
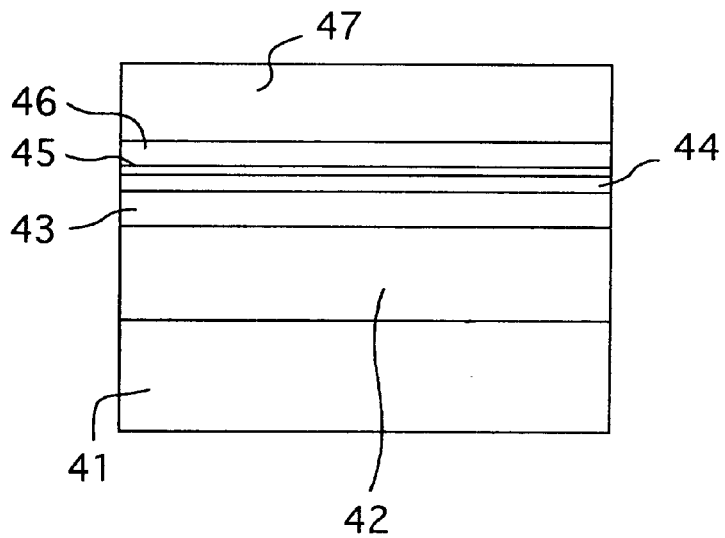
FIGS. 10A to 10H are sectional views showing steps of forming a semiconductor laser according to a third embodiment of the present invention.

First, as shown in FIG. 10A, the n-$Al_{0.09}Ga_{0.91}N$ cladding layer 42, the n-GaN SCH layer 43, the n-GaN multiple quantum well (MQW) active layer 44, the p-$Al_{0.18}Ga_{0.82}N$ electron blocking layer 45, the p-GaN SCH layer 46, and the first p-$Al_{0.09}Ga_{0.91}N$ cladding layer 47 are grown in sequence on the (0001) face of the ntype silicon carbide (SiC) substrate 41 by using the MOCVD method respectively. Thickness and composition of these layers are set similar to those in the second embodiment.

Figure 10B:
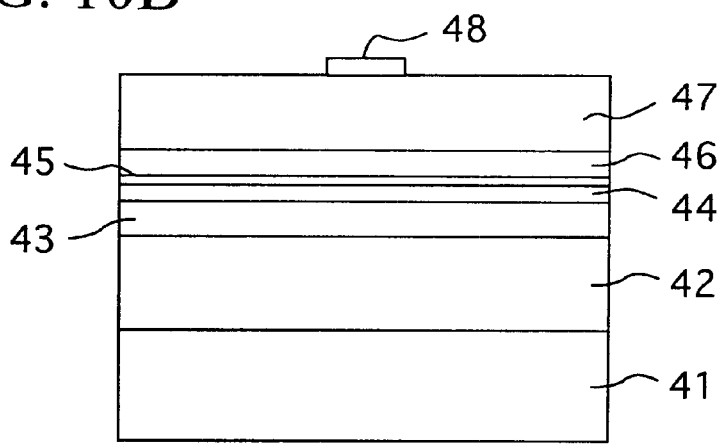

Then, as shown in FIG. 10B, the stripe-shaped mask 48 is formed on the first p-$Al_{0.09}Ga_{0.91}N$ cladding layer 47. The mask 48 is formed of the $SiO_2$ film 48 which has a stripe shape which has a width of 0.5 to 2.0 μm and has a thickness of 300 nm. The mask 48 is patterned by the method shown in the second embodiment.

Figure 10C:
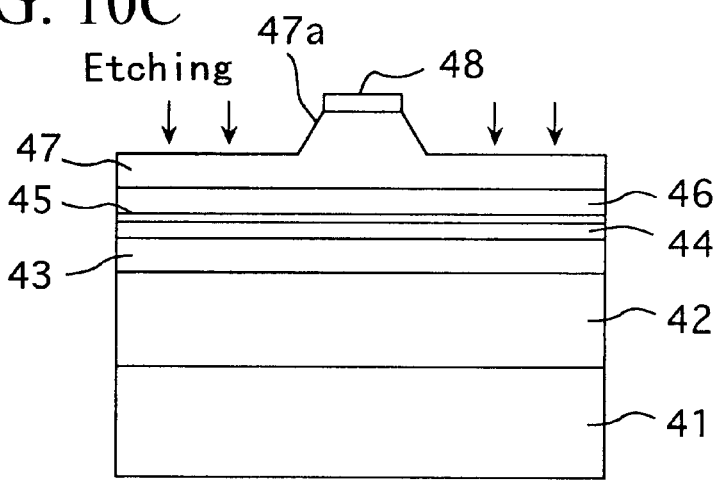

Then, a region of the first p-$Al_{0.09}Ga_{0.91}N$ cladding layer 47, which is not covered with the mask 48, is etched. As shown in FIG. 10C, a depth of this etching is set like the first embodiment. The mesa portion 47a of the first p-$Al_{0.09}Ga_{0.91}N$ cladding Layer 47 is formed under the mask 48.

Since the light emitting region of the active layer 44 is protected by the mask 48 during etching, no damage is applied to the light emitting region.

Figure 10D:
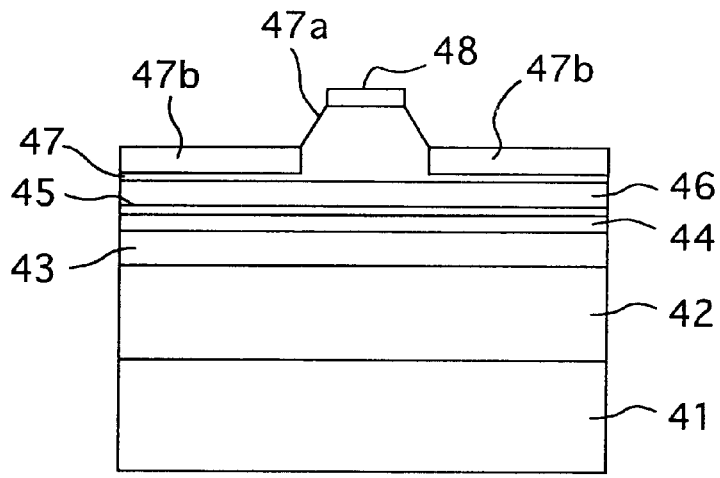

Then, as shown in FIG. 10D, acceptors in the first p-$Al_{0.09}Ga_{0.91}N$ cladding layer 47 are made inactive on both sides of the mask 48 by injecting hydrogen ions into both sides of the mask 48 or scattering the hydrogen thereinto to form high resistance layers 47b there. The high resistance layers 47b may be formed only in the first p-$Al_{0.09}Ga_{0.91}N$ cladding layer 47 as shown in FIG. 10D, otherwise they may be formed to have a depth reaching the n-$Al_{0.09}Ga_{0.91}N$ cladding layer 42.

When the high resistance layers 47b are formed, an element injected or scattered from the upper surface of the first p-$Al_{0.09}Ga_{0.91}N$ cladding layer 47 is not limited to the hydrogen, and nitrogen, argon, etc. may be employed. As the method of scattering the element, the annealing in the atmosphere containing the element or the ion diffusion by-using the ECR equipment may be considered.

Figure 10E:
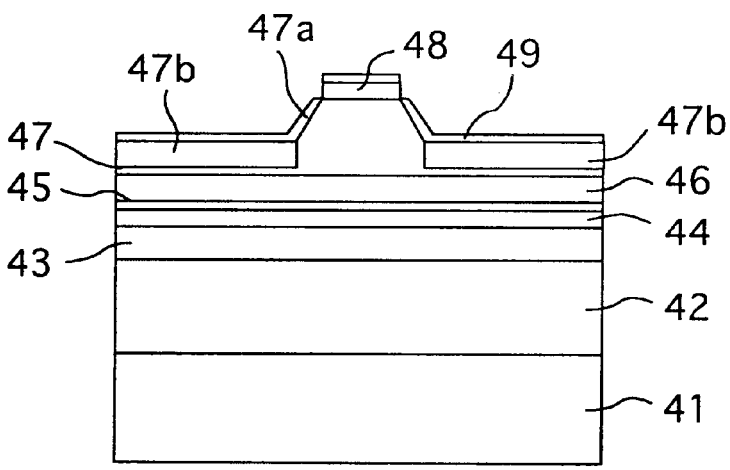

Then, as shown in FIG. 10E, the insulating AlN layer 49 of 20 nm thickness is formed on the mask 48, the first p-$Al_{0.09}Ga_{0.91}N$ cladding layer 47, and the high resistance layer 47b by the ECR sputtering method.

Figure 10F:
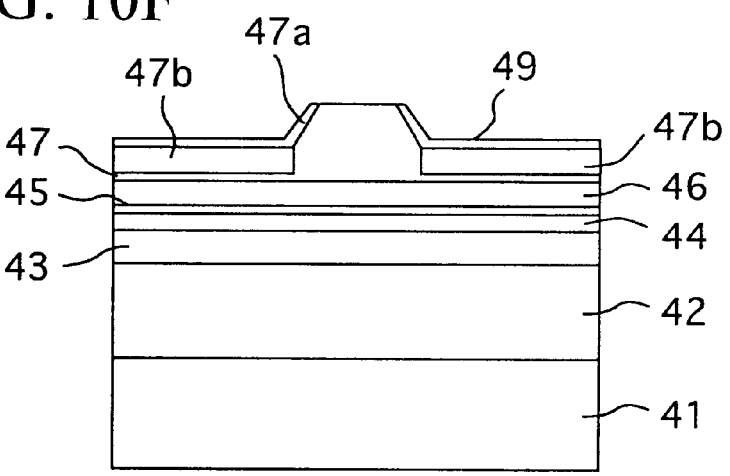

Then, the lift-off of the AlN layer 49 on the mask 48 is carried out by etching the mask 48 on the mesa portion 47a by means of the hydrofluoric acid. As a result, as shown in FIG. 10F, the AlN layer 49 is left on the side surfaces of the mesa portion 47a and an opening is formed in the AlN layer 49 on the mesa portion 47a.

Figure 10G:
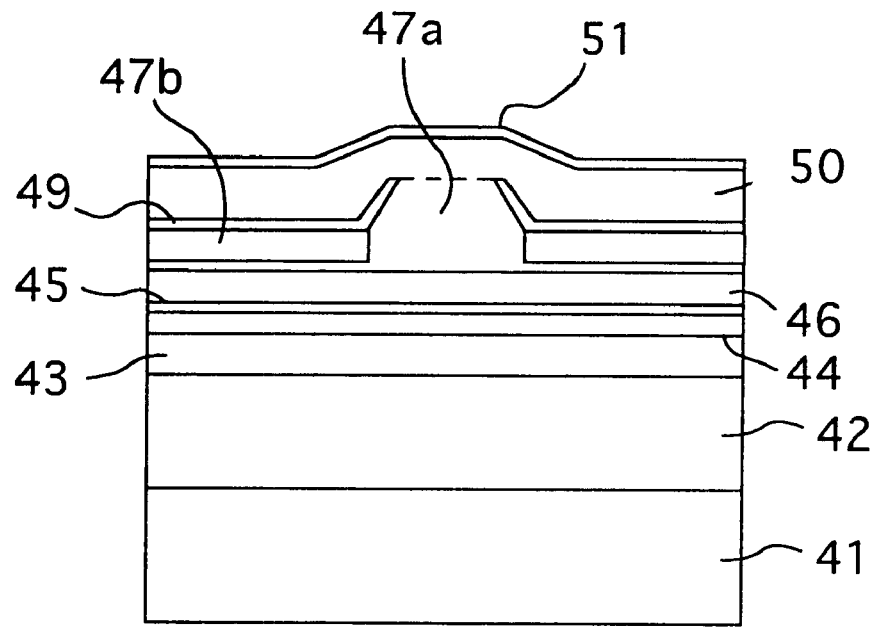

Then, the second crystal growth is performed by the MOCVD method. More particularly, as shown in FIG. 10G, the second p-$Al_{0.09}Ga_{0.91}N$ cladding layer 50 and the p-GaN contact layer 51 are formed on the AlN layer 49 and the mesa portion 47a to have a thickness of 0.7 μm and 0.05 μm respectively.

In this case, the cladding layer 50 and the contact layer 51 are crystal-grown on not only the AlN layer 49 but also the AlN layer 49. The insulating layer formed of AlGaN, GaN, or $Si_3N_4$ may be grown by the MOCVD or the ECR in place of the AlN layer 49. The cladding-layer 50 formed on the film is crystallized.

Figure 10H:
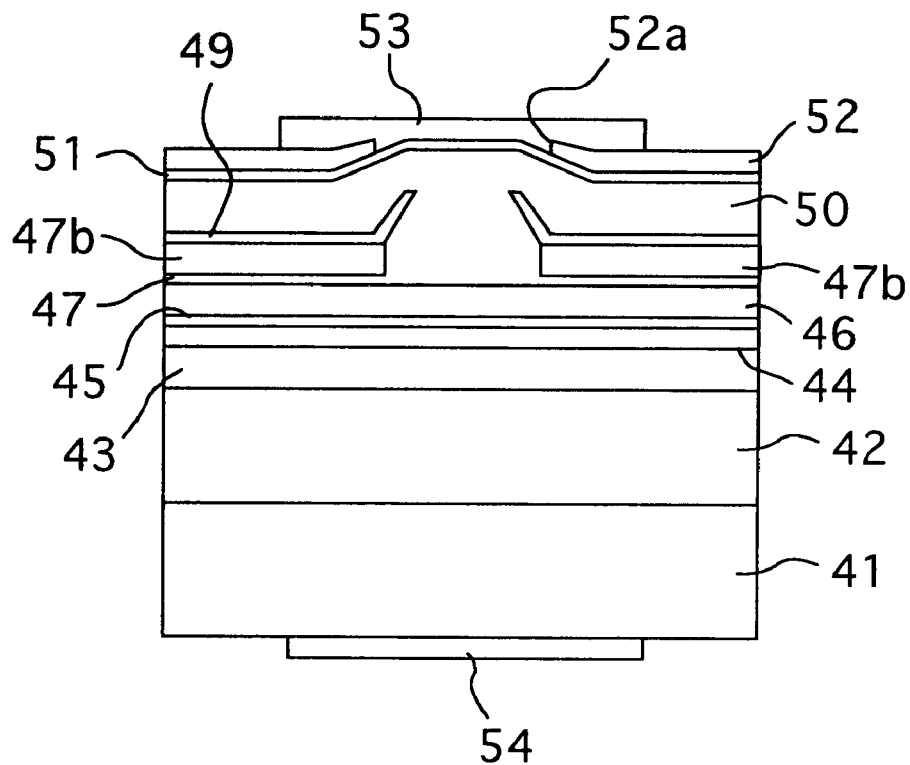

Then, as shown in FIG. 10H, the insulating film 52 made of $SiO_2$ is formed on the contact layer 51, and then the opening 52a is formed over the mesa portion 47a by patterning the insulating film 52 by virtue of the photolithography method. Then, the p-side electrode 53 connected to the contact layer 51 is formed in the opening 52a and on the peripheral insulating film 52.

Then, the n-side electrode 54 is formed under the SiC substrate 41.

With the above steps, a basic structure of the blue light emitting semiconductor laser can be completed.

According to the above semiconductor laser, like the semiconductor laser according to the second embodiment, degradation of the surface morphology of the ALN layer 49 can be suppressed, deterioration of the active layer 44 in the light emitting region can be reduced, and scattering of the current to both sides of the light emitting region can be suppressed.

In addition, since the high resistance layers 47b are formed on both side of the mesa portion 47a, the current flowing to both sides of the mesa portion 47a can be further reduced rather than the semiconductor laser shown in the second embodiment and thus the threshold current can be further lowered.

In the third embodiment, since the AlN layer 49 can function as both the lateral mode controlling layer and the current constricting layer, a contact area between the upper electrode 53 and the contact layer 51 can be increased, and thus a contact resistance can be reduced like the second embodiment. Therefore, an device resistance can be lowered.

A sapphire substrate, a GaN substrate, etc. may be employed in place of the above Sic substrate. Also, composition and thickness of the buffer and the cladding layer, composition and thickness of the active layer, the number of well layers, etc. are not limited to above structure if these layers are formed by AlGaInN material.

Further, material of the mask 48 is not limited to $SiO_2$, and other insulating film such as SiON may be employed.

(Fourth Embodiment)

In the third embodiment, the structure which includes the mesa portion formed in the first p-$Al_{0.09}Ga_{0.91}N$ cladding layer and the high resistance layers formed on both sides of the mesa portion is adopted. But such mesa portion may be omitted, and thus an example of such structure will be explained in the following.

Figure 11A:
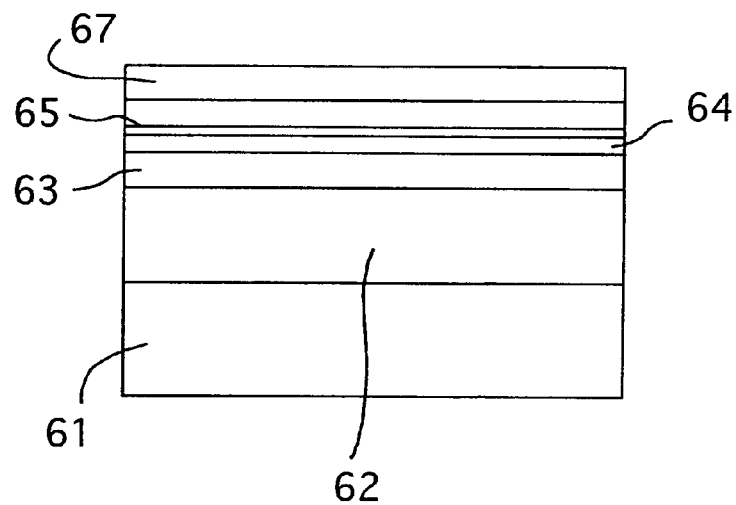
FIGS. 11A to 11G are sectional views showing steps of forming a semiconductor laser according to a fourth embodiment of the present invention.

At first, as shown in FIG. 11A, an n-type (n-) $Al_{0.09}Ga_{0.91}N$ cladding layer 62 of 1.5 μm thickness, an n-GaN SCH layer 63 of 100 nm thickness, an undoped InGaN multiple quantum well (MQW) active layer 64, a p-type (p-) $Al_{0.18}Ga_{0.82}N$ electron blocking layer 65 of 20 nm thickness, a p-GaN SCH layer 66 of 100 nm thickness, and a first p-$Al_{0.09}Ga_{0.91}N$ cladding layer 67 which has a thickness of more than 0 μm and less than 5 μm are grown in sequence on a (0001) face of an n-type silicon carbide (SiC) substrate 61 by using the MOCVD method respectively.

The multiple quantum well active layer 64 has a structure in which an $In_{0.15}Ga_{0.85}N$ well layer is put. between four $In_{0.03}Ga_{0.97}N$ barrier layers respectively.

The barrier layer has a thickness of 5 nm and the well layer has a thickness of 4 nm.

Figure 11B:
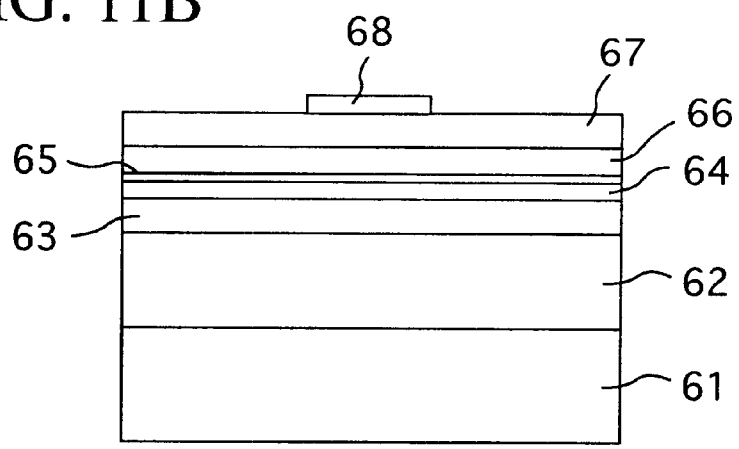

Then, an $SiO_2$ film 68 is formed on the first p-$Al_{0.09}Ga_{0.91}N$ cladding layer 67 by the thermal CVD method to have a thickness of 300 nm. Then, as shown in FIG. 11B, the $SiO_2$ film 48 is patterned into a stripe shape which has a width of 0.5 to 2.0 μm, e.g., 1.5 μm, by the photolithography method. This stripe shape is used as a mask.

Figure 11C:
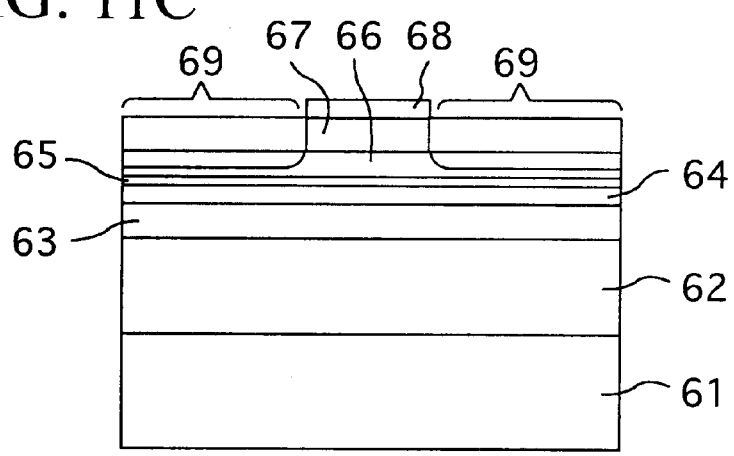

Then, as shown in FIG. 11C, acceptors in a region of the first p-$Al_{0.09}Ga_{0.91}N$ cladding layer 67, which is not covered with the mask 68, are made inactive by injecting hydrogen ions into both sides of the mask 68 or scattering the hydrogen thereinto to form high resistance layers 69 there. The high resistance layers 69 may be formed only in the first p-$Al_{0.09}Ga_{0.91}N$ cladding layer 67, otherwise they may be formed to have a depth reaching the p-GaN SCH layer 66, as shown in FIG. 11C, otherwise they may be formed to have a depth reaching the n-$Al_{0.09}Ga_{0.91}N$ cladding layer 62.

In case the high resistance layers 69 are formed, an element injected or scattered from the upper surface of the first p-$Al_{0.09}Ga_{0.91}N$ cladding layer 67 is not limited to the hydrogen, and nitrogen, argon, etc. may be employed. As the method of scattering the element, the annealing in the atmosphere containing the element or the ion diffusion by using the ECR equipment may be considered.

Figure 11D:
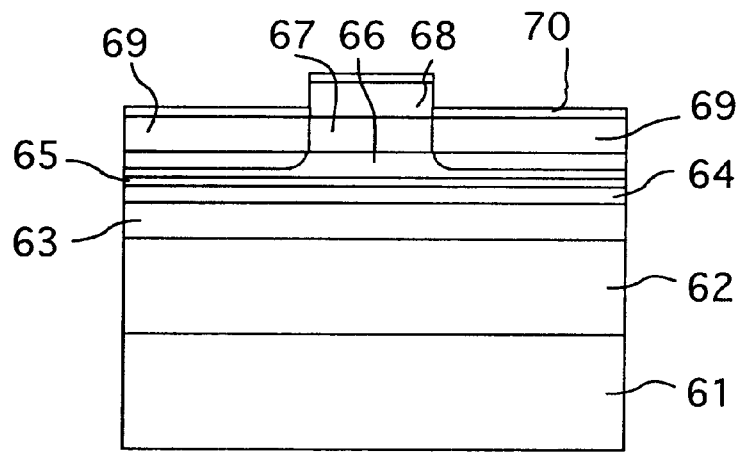

After this, as shown in FIG. 11D, an insulating AlN. layer 70 of 20 nm thickness is formed on the mask 68, the first p-$Al_{0.09}Ga_{0.91}N$ cladding layer 67, and the high resistance layers 69 by the ECR sputtering method.

Figure 11E:
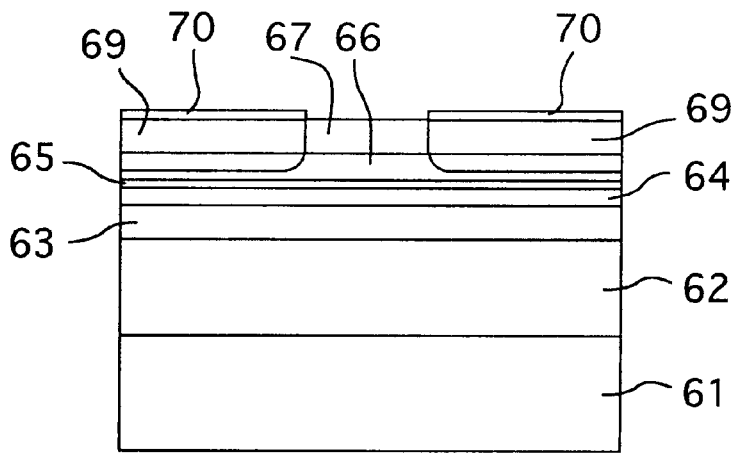

Then, the lift-off of the AlN layer 70 on the mask 68 is carried out by etching the mask 68 using the hydrofluoric acid. Accordingly, as shown in FIG. 11E, an opening is formed in the AlN layer 70 and the first p-$Al_{0.09}Ga_{0.91}N$ cladding layer 67 is exposed from the opening. The AlN layer 70 left by the lift-off can function as both the lateral mode controlling layer and the current constricting layer.

Figure 11F:
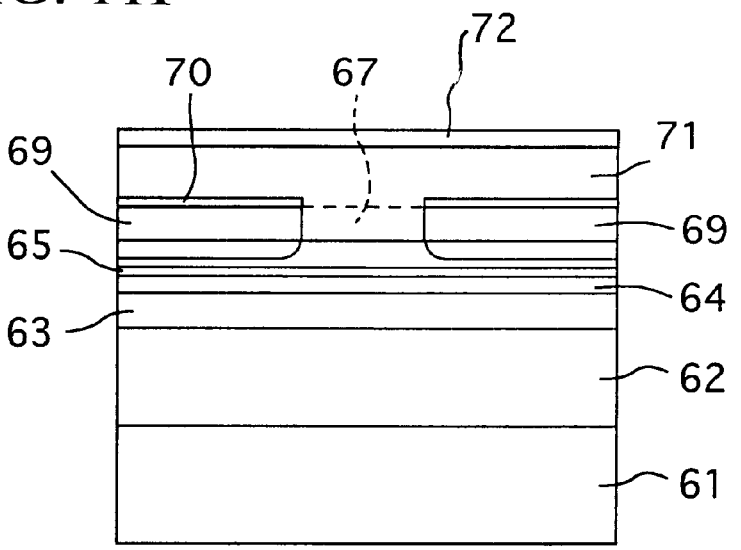

Then, the second crystal growth is carried out by the MOCVD method. More particularly, as shown in FIG. 11F, a second p-$Al_{0.09}Ga_{0.91}N$ cladding layer 71 and a p-GaN contact layer 72 are formed on upper surfaces of the AlN layer 70 and the first p-$Al_{0.09}Ga_{0.91}N$ cladding layer 67 to have a thickness of 0.7 μm and 0.05 μm respectively.

In this case, crystals of the cladding layer 60 and the contact layer 61 are grown on not only the first p-$Al_{0.09}Ga_{0.91}N$ cladding layer 67 but also the AlN layer 70. An insulating layer formed of AlGaN, GaN, or $Si_3N_4$ may be grown in place of the AlN layer 49 by the MOCVD or the ECR. The cladding layer 71 formed on the film is crystallized.

Figure 11G:
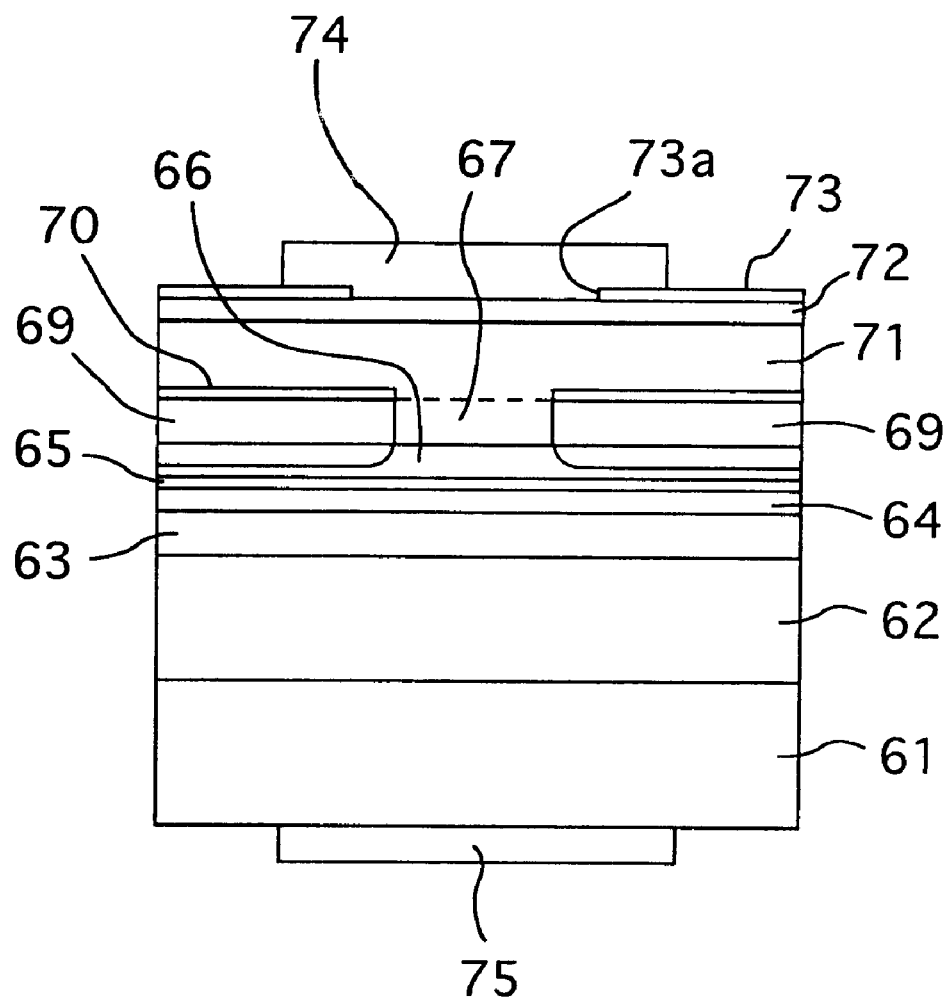

Then, as shown in FIG. 11G, an insulating film 73 made of $SiO_2$ is formed on the contact layer 72, and then an opening 73a is formed over the light emitting region by patterning the insulating film 73 by virtue of the photolithography method. Then, a p-side electrode 74 connected to the contact layer 72 is formed in the opening 73a and on the peripheral insulating film 73. Also, an n-side electrode 75 is formed under the SiC substrate 61.

With the above steps, a basic structure of the blue light emitting semiconductor laser can be completed.

In the above-mentioned steps, since the high resistance layers 69 are formed in the region of the first cladding layer 67, which is not located over the light emitting region, by the ion implantation or the ion diffusion, the first cladding layer 67 can be formed to have substantially a mesa shape under the AlN layer 70.

Accordingly, since the first cladding layer 67 is formed thick on the light emitting region of the active layer 64 and also the AlN layer 70 is formed thereon by the ECR, the light emitting region of the active layer 64 is never subjected to the damage, control of the film formation of the AlN layer 70 can be facilitated, and the surface morphology of the AlN layer 70 is not degraded.

In addition, since the first cladding layer 67 on both sides of the light emitting region can be formed substantially thin because of the formation of the high resistance layers 69, the current can be prevented from scattering to the first cladding layer 67 formed in the region other than the light emitting region and also reduction in the threshold value can be achieved.

In the fourth embodiment, since the AlN layer 49 and the high resistance layers 69 can function as the current constricting layer, a contact area between the upper electrode 63 and the contact layer 61 can be increased, and thus a contact resistance can be reduced like the second embodiment. Therefore, an device resistance can be lowered.

A sapphire substrate, a GaN substrate, etc. may be employed in place of the above SiC substrate. Also, composition and thickness of the buffer and the cladding layer, composition and thickness of the active layer, the number of well layers, etc. are not limited to above structure if these layers are formed by AlGaInN material.

Further, material of the mask 68 is not limited to $SiO_2$, and other insulating film such as SiON, may be employed.

As described above, according to the present invention, since the lateral mode controlling layer which is formed of AlN having a thickness of less than 300 nm is provided in the cladding layer or between the cladding layer and the active layer, lateral mode control of the group III–V compound semiconductor laser can be facilitated, the aspect ratio of the beam shape can be improved, and generation of the higher modes can be prevented. In addition, since the lift-off method is employed as the patterning method for the AlN layer. constituting the lateral mode controlling layer, the lift-off mask covers the light emitting region to thus reduce the damage caused by the Al layer growth and the patterning and also the laser characteristics can be improved.

Also, according to the present invention, since the structure in which the side surface of the opening of the light emitting region formed in the above cladding layer is risen is employed, the light emitting region of the active layer can be protected by the thick cladding layer in forming the lateral mode controlling layer. In addition, since the optical confinement layer is located close to the active layer on both sides of the light emitting region, the good lateral mode control can be achieved and also spreading of the current in the cladding layer can be suppressed to thus reduce the threshold current.

In the present invention, since the high resistance layers are formed under the lateral mode controlling layer, spreading of the current in the cladding layer can be further suppressed and also the threshold current can be further reduced. In addition, since the method of dry-etching the cladding layer is adopted to form the mesa portion in the cladding layer on the active layer, the current constricting effect can be achieved much more.

What is claimed is:

1. A compound semiconductor laser comprising:
   an active layer which is disposed between a one conductivity type cladding layer and an opposite conductivity type cladding layer and is formed of group III nitride;
   a first SCH layer which is disposed between the active layer and the one conductivity type cladding layer;
   a second SCH layer which is disposed between the active layer and the opposite conductivity type cladding layer; and
   a lateral mode controlling layer which is formed in one of the cladding layers, and is formed of AlN having a thickness of more than 0 nm but less than 100 nm.

2. A compound semiconductor laser comprising:
   an active layer which is disposed between a one conductivity type cladding layer and an opposite conductivity type cladding layer and is formed of group III nitride;
   a first SCH layer which is disposed between the active layer and the one conductivity type cladding layer;
   a second SCH layer which is disposed between the active layer and the opposite conductivity type cladding layer; and
   a lateral mode controlling layer which is disposed either between the one conductivity type cladding layer and the first SCH layer or between the opposite conductivity cladding layer and the second SCH layer, and is formed of AlN having a thickness of more than 0 nm but less than 100 nm.

3. A compound semiconductor laser comprising:
   an active layer which is disposed between a one conductivity type cladding layer and an opposite conductivity type cladding layer and is formed of group III nitride;
   a first SCH layer which is disposed between the active layer and the one conductivity type cladding layer;
   a second SCH layer which is disposed between the active layer and the opposite conductivity type cladding layer; and
   a lateral mode controlling layer which is disposed-either between the first SCH layer and the active layer or between the second SCH layer and the active layer, and is formed of AlN having a thickness of more than 0 nm but less than 100 nm.

4. A semiconductor light emitting device comprising:
   an active layer formed of gallium nitride compound semiconductor;
   an upper cladding layer and a lower cladding layer formed of gallium nitride compound semiconductor whose energy band is larger than the active layer to put the active layer therebetween; and
   an insulating layer formed of AlN or AlGaN or GaN in a current constricting region in the upper cladding layer, and having a risen portion on both sides of a current passing region.

5. A semiconductor light emitting device comprising:
   an active layer formed of gallium nitride compound semiconductor;
   an upper cladding layer and a lower cladding layer formed of gallium nitride compound semiconductor whose energy band is larger than the active layer to put the active layer therebetween;
   a current constricting insulating layer formed of AlN or AlGaN or GaN in a current constricting region in the upper cladding layer to have an opening in a current passing region; and
   high resistance regions in which an impurity in the upper cladding layer under the insulating layer is made inactive.

6. A semiconductor light emitting device according to claim 5, wherein any of hydrogen, nitrogen, and argon are introduced into the high resistance regions.

7. A semiconductor light emitting device according to claim 5, wherein the insulating layer is risen on both sides of the current passing region.

8. A semiconductor light emitting device according to claim 5, wherein the high resistance regions reach any one of the upper cladding layer, the active layer, and the lower cladding layer.

9. A semiconductor light emitting device according to claim 4 or 5, wherein a thickness of the insulating layer is 1 nm to 30 nm.

10. A semiconductor light emitting device according to any one of claims 4 or 7, wherein the insulating layer except risen portions is formed in parallel with the active layer.

11. A semiconductor light emitting device according to any one of claims 4, or 7, wherein a maximum angle of the risen portions of the insulating layer relative to the active layer is set larger than 30° but smaller than 150°.

12. A semiconductor light emitting device according to claim 4 or 5, wherein two SCH layers are formed between the active layer and the upper cladding layer and between the active layer and the lower cladding layer respectively.

13. A compound semiconductor laser comprising:

an active layer which is disposed between a one conductivity type cladding layer and an opposite conductivity type cladding layer and is formed of group III nitride;

a first SCH layer which is disposed between the active layer and the one conductivity type cladding layer;

a second SCH layer which is disposed between the active layer and the opposite conductivity type cladding layer; and a lateral mode controlling layer which is formed either in the first SCH layers or in the second SCH layer, and is formed of AlN having a thickness of more than 0 nm but less than 100 nm.

* * * * *